(12) United States Patent
Okamoto

(10) Patent No.: US 11,035,923 B2
(45) Date of Patent: Jun. 15, 2021

(54) MAGNETIC RESONANCE IMAGING APPARATUS

(71) Applicant: Canon Medical Systems Corporation, Otawara (JP)

(72) Inventor: Kazuya Okamoto, Saitama (JP)

(73) Assignee: Canon Medical Systems Corporation, Otawara (JP)

( * ) Notice: Subject to any disclaimer, the term of this patent is extended or adjusted under 35 U.S.C. 154(b) by 65 days.

(21) Appl. No.: 16/686,264

(22) Filed: Nov. 18, 2019

(65) Prior Publication Data

US 2020/0158806 A1 May 21, 2020

(30) Foreign Application Priority Data

Nov. 20, 2018 (JP) .............................. JP2018-217390

(51) Int. Cl.
*G01R 33/567* (2006.01)

(52) U.S. Cl.
CPC ................................ *G01R 33/5673* (2013.01)

(58) Field of Classification Search
CPC .......................... G01R 33/567; G01R 33/5673
See application file for complete search history.

(56) References Cited

U.S. PATENT DOCUMENTS

| | | | | |
|---|---|---|---|---|
| 4,991,587 A * | 2/1991 | Blakeley | ............ | G01R 33/5673 600/483 |
| 2005/0107681 A1* | 5/2005 | Griffiths | ............... | G01R 33/567 600/410 |
| 2011/0074409 A1* | 3/2011 | Stoughton | .......... | G01R 33/5673 324/307 |
| 2015/0320342 A1 | 11/2015 | Biber et al. | | |
| 2015/0335268 A1 | 11/2015 | Biber et al. | | |

FOREIGN PATENT DOCUMENTS

| | | |
|---|---|---|
| JP | 61-25543 A | 2/1986 |
| JP | 61-154656 A | 7/1986 |
| JP | 4962947 B2 | 6/2012 |

OTHER PUBLICATIONS

Brüser, C. et al., "Ambient and Unobtrusive Cardiorespiratory Monitoring Techniques," IEEE Reviews in Biomedical Engineering, vol. 8, 2015, 14 pages.

* cited by examiner

*Primary Examiner* — Gregory H Curran
(74) *Attorney, Agent, or Firm* — Oblon, McClelland, Maier & Neustadt, L.L.P.

(57) ABSTRACT

A magnetic resonance imaging apparatus according to an embodiment includes a monitoring coil, a measuring device, and processing circuitry. The monitoring coil continuously transmits to a subject an electromagnetic wave having a monitoring frequency, and without touching the subject. The measuring device measures a change in the impedance related to the monitoring coil over time to thereby generate a biosignal of the subject. The processing circuitry is configured to determine the monitoring frequency that is higher than a frequency of a high-frequency magnetic field based on the information of the subject, and to controls a sequence related to the imaging based on the biosignal.

11 Claims, 18 Drawing Sheets

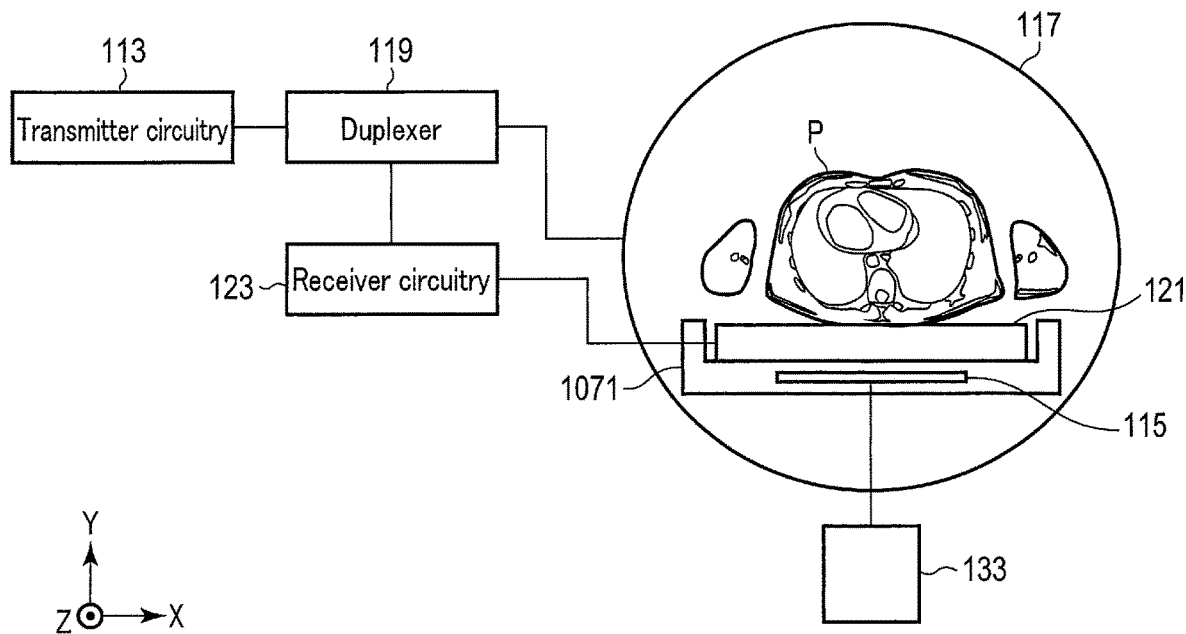
F I G. 2
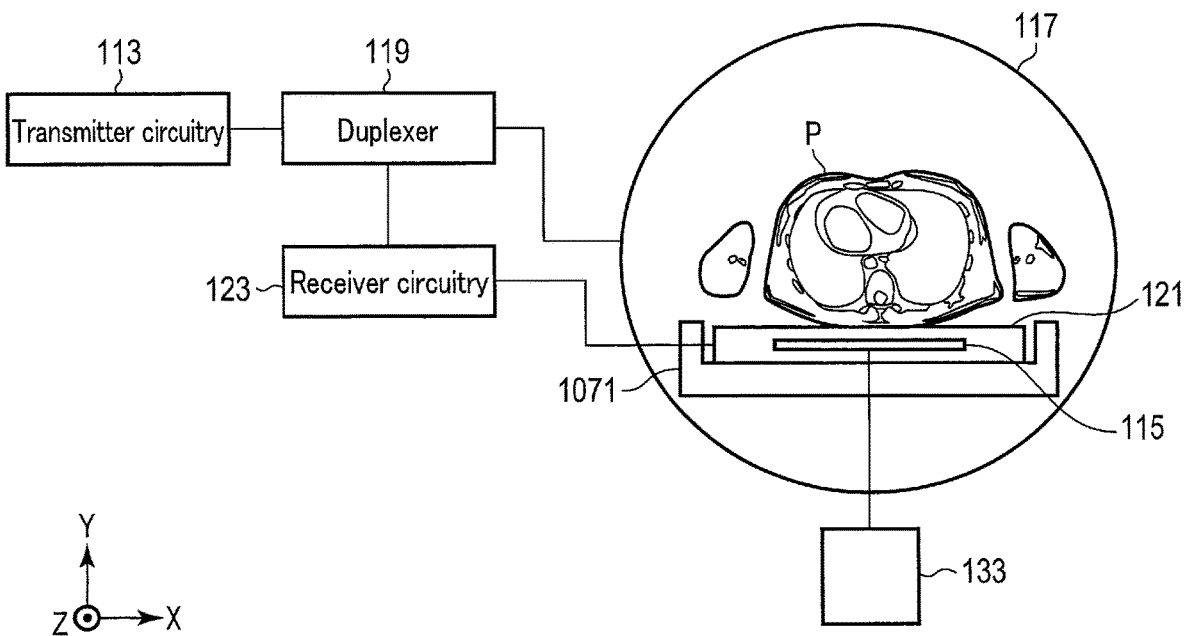
F I G. 3

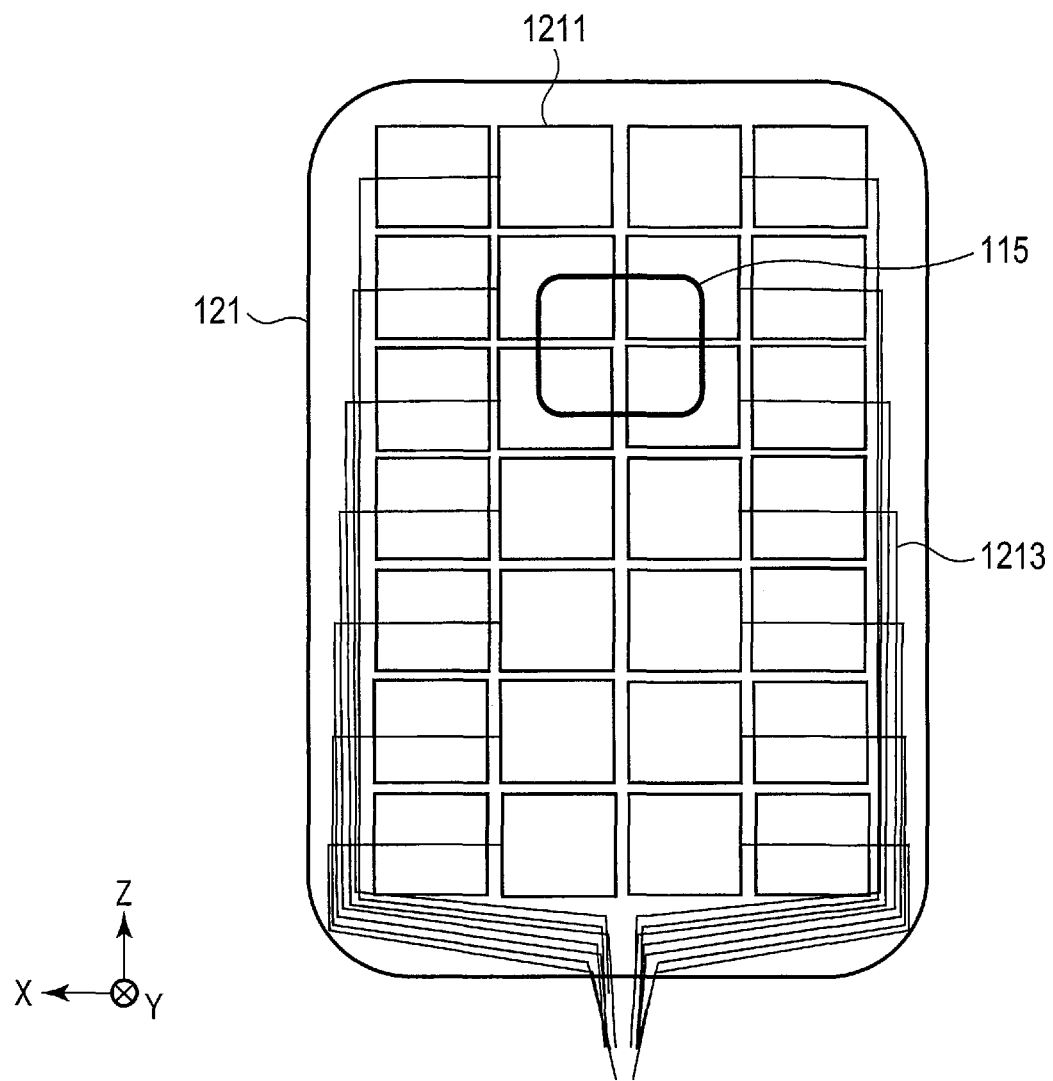
F I G. 5

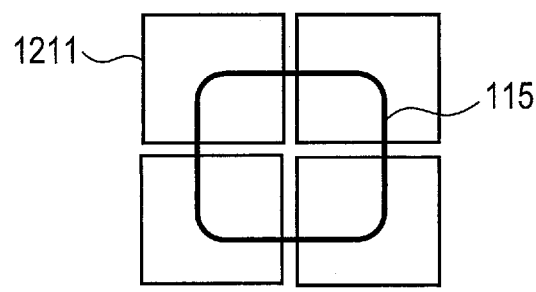
F I G. 6
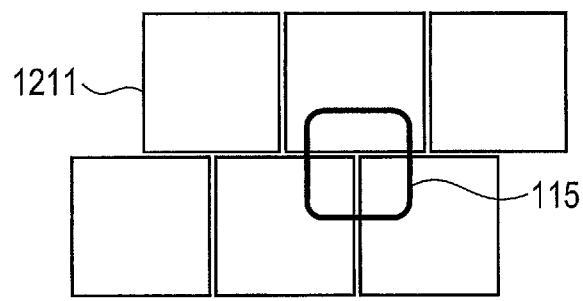
F I G. 7

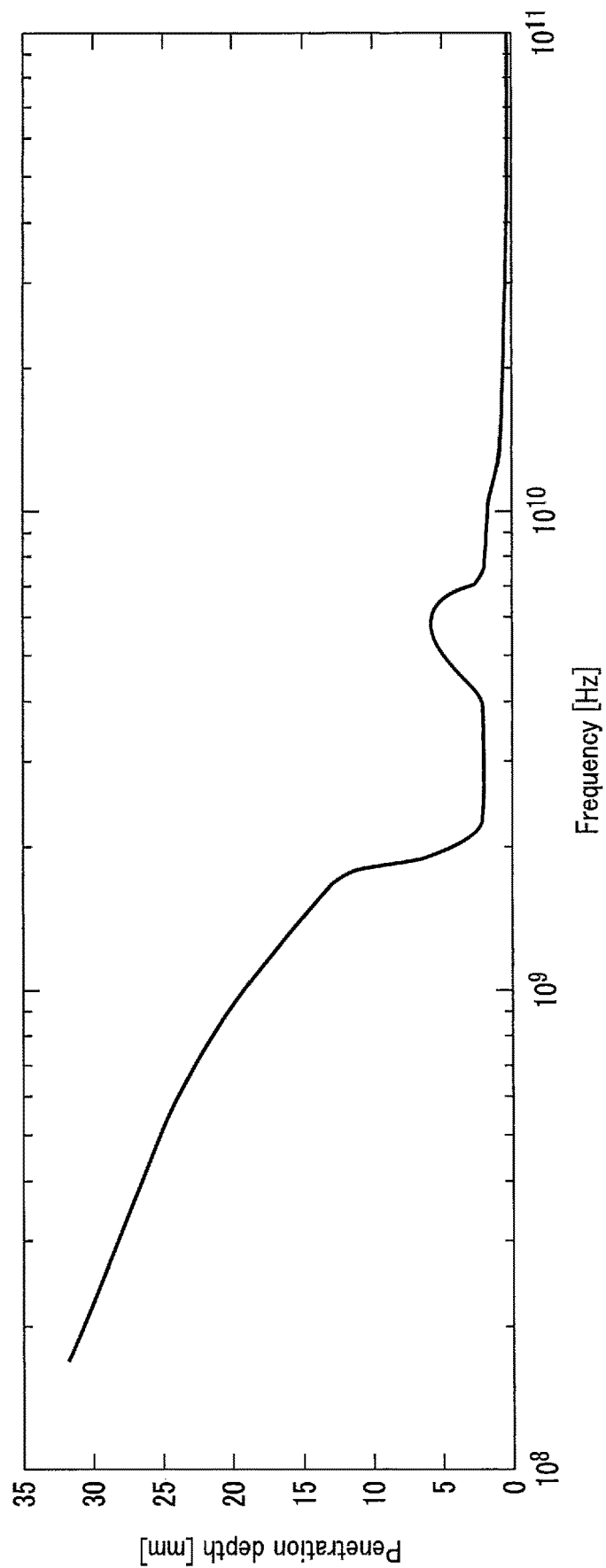
F I G. 8

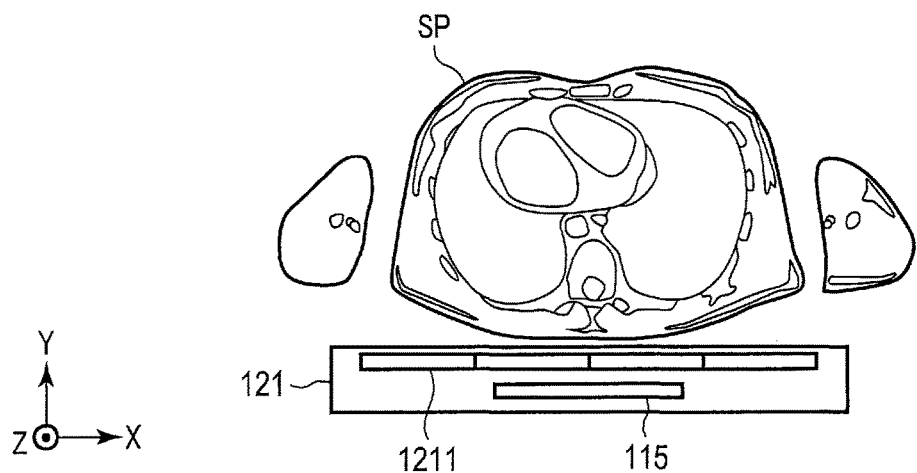
FIG. 9
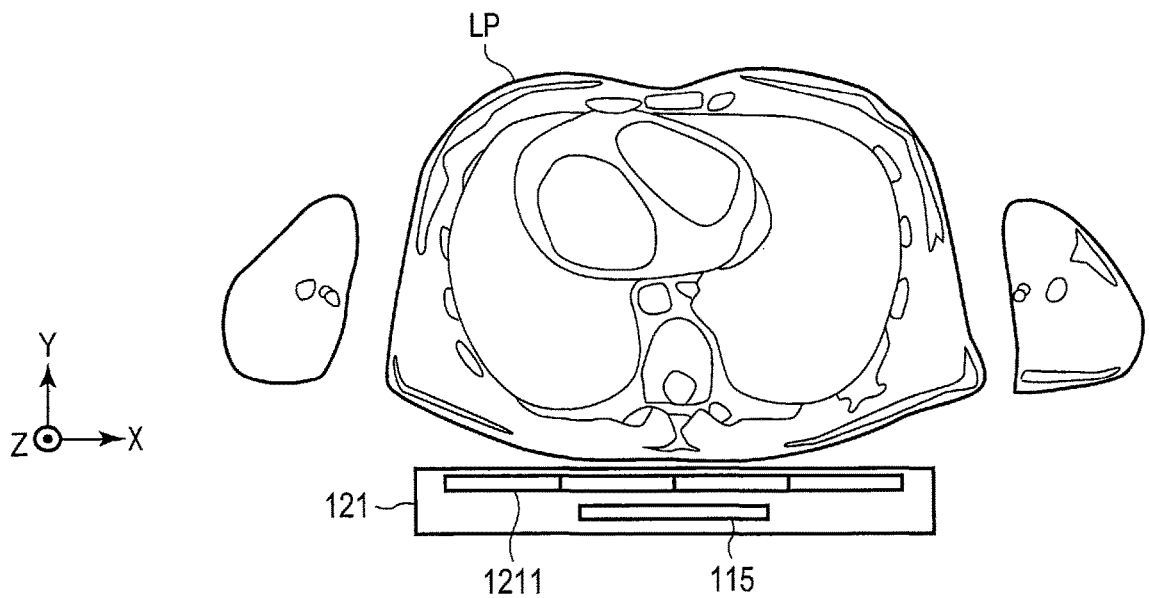
FIG. 10
| Physical attributes (Body height range, Body weight range) | $(HR_1, WR_1)$ | ... | $(HR_i, WR_j)$ | ... | $(HR_n, WR_m)$ |
|---|---|---|---|---|---|
| Monitoring frequency (Hz) | $F_{11}$ | ... | $F_{ij}$ | ... | $F_{nm}$ |
FIG. 11

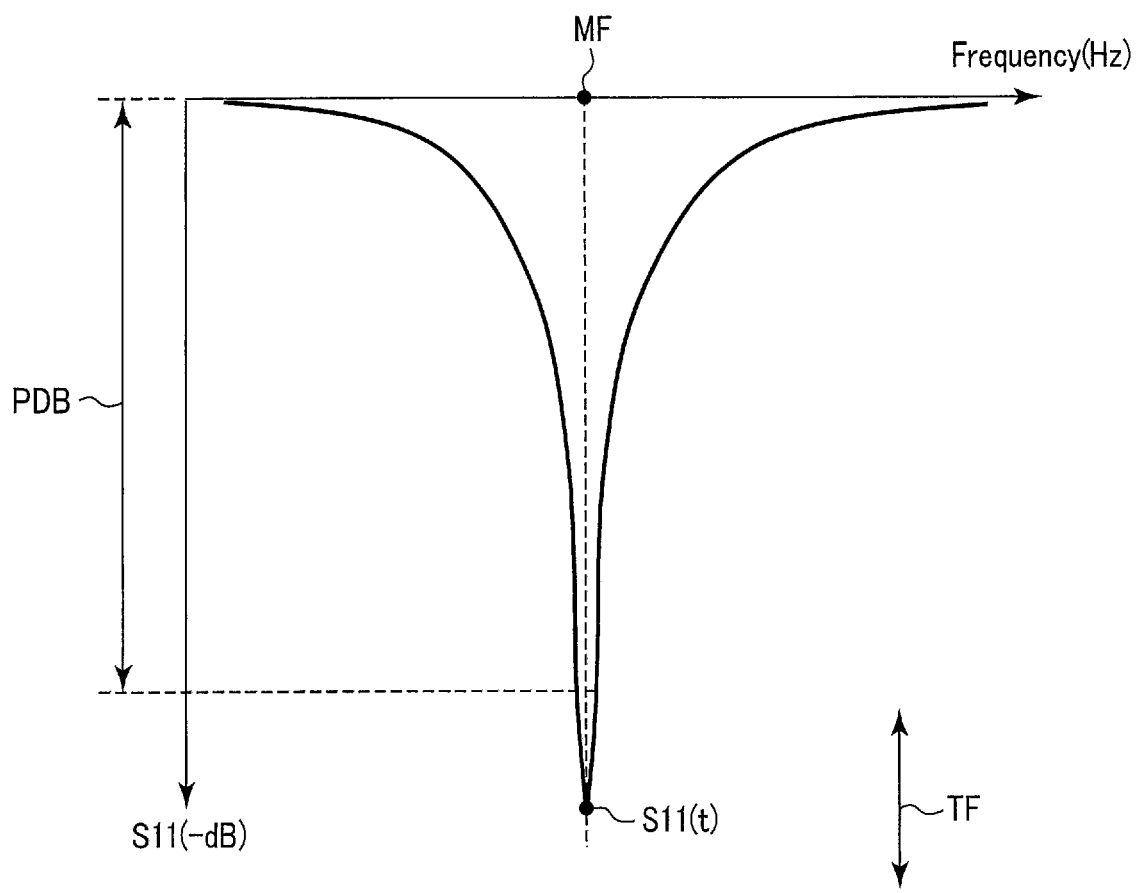
F I G. 13

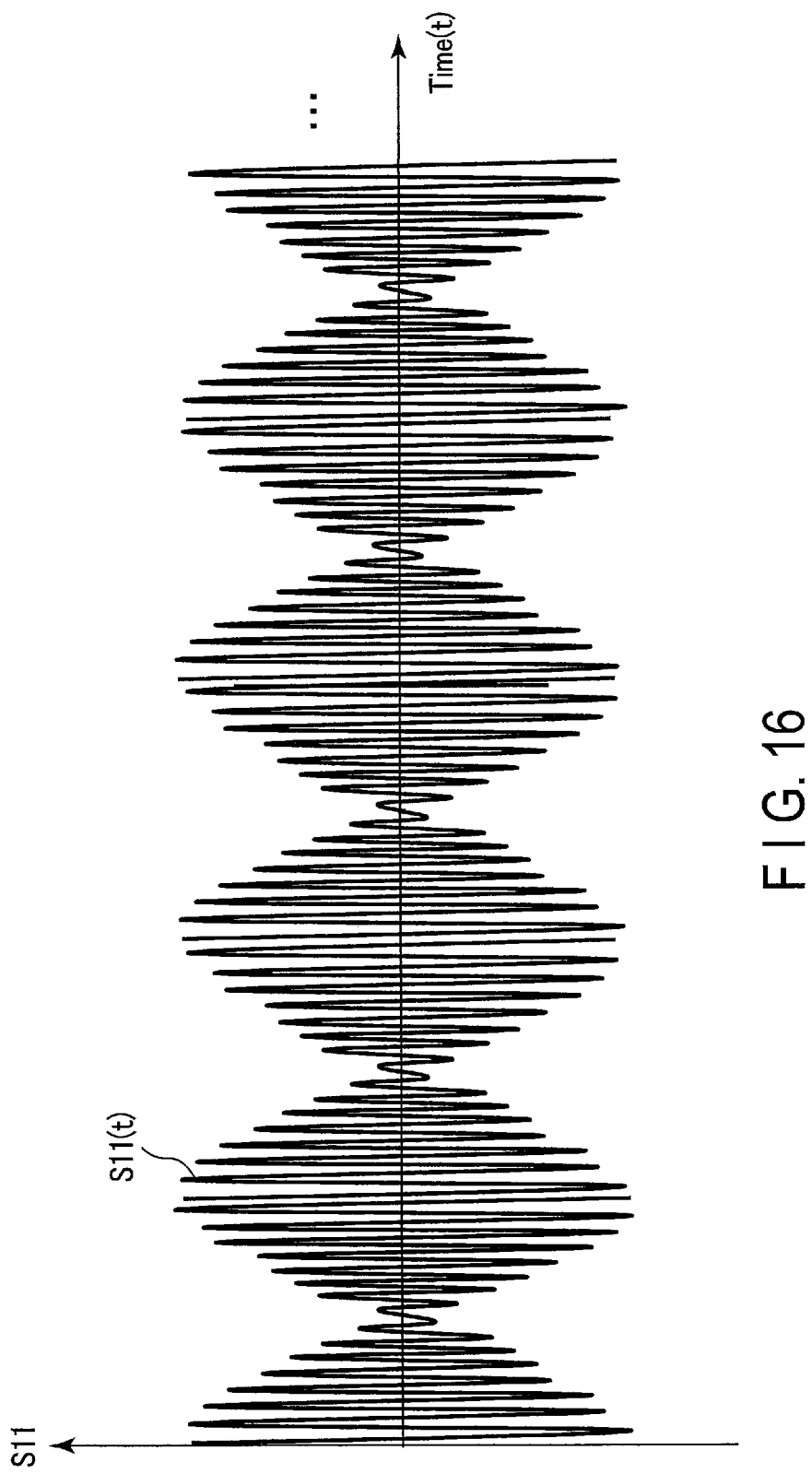
F I G. 16

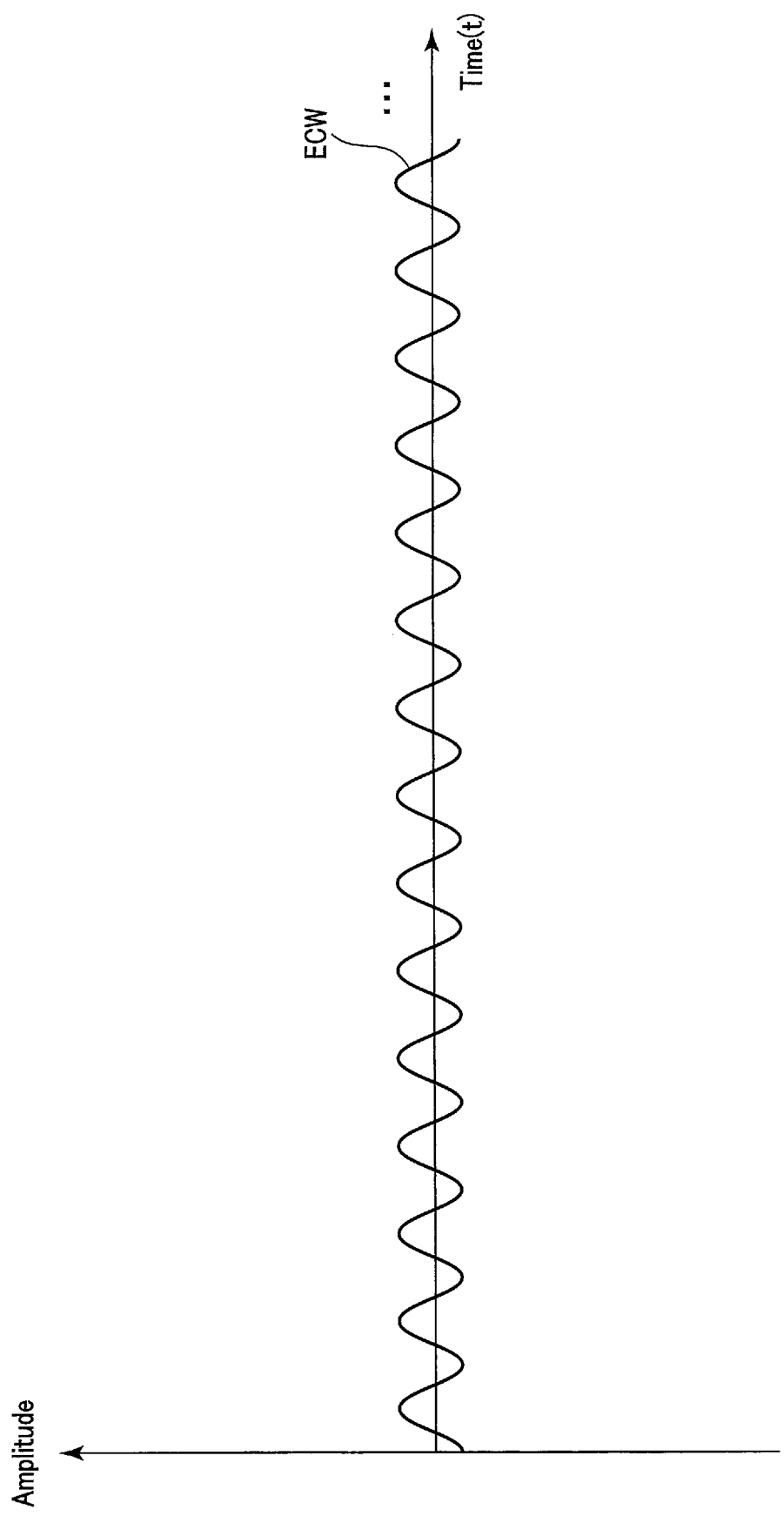
F I G. 18

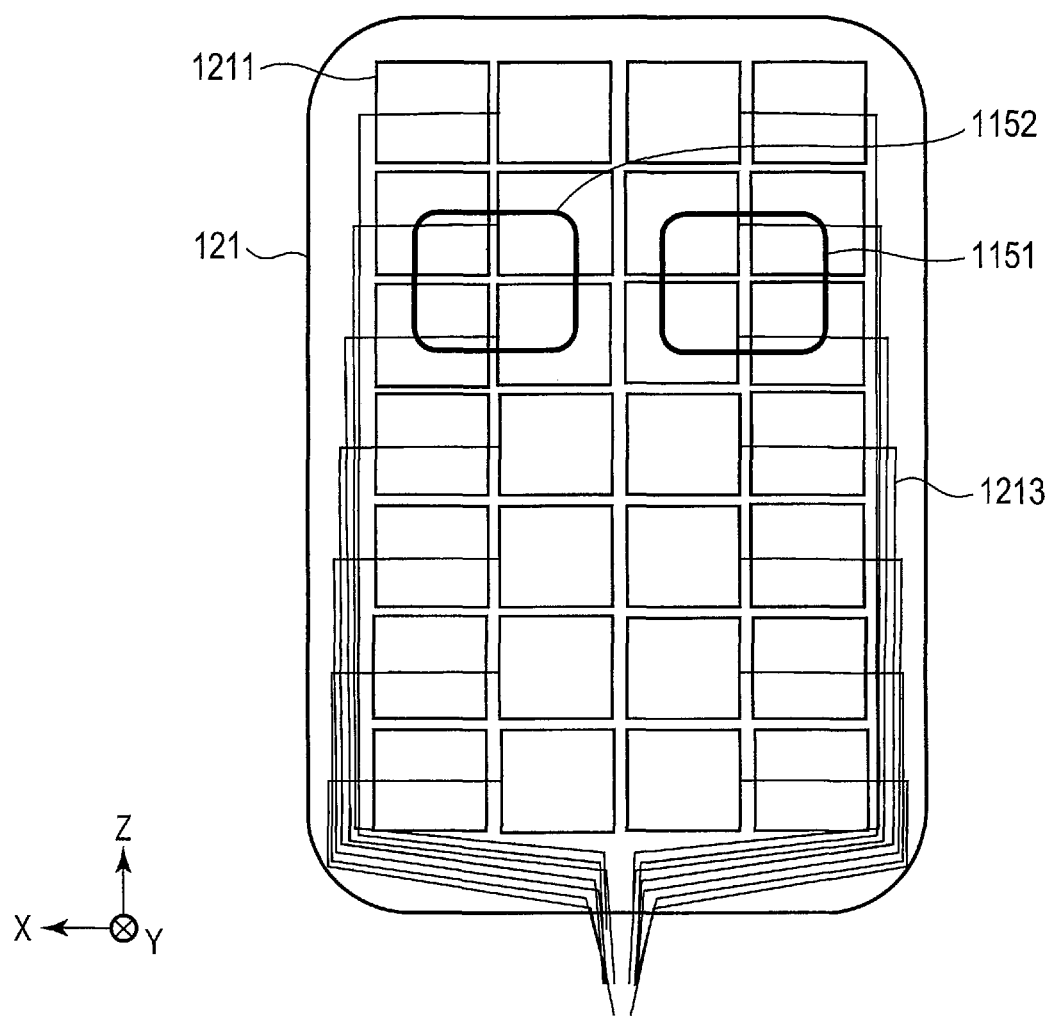
F I G. 20

MAGNETIC RESONANCE IMAGING APPARATUS

CROSS-REFERENCE TO RELATED APPLICATIONS

This application is based upon and claims the benefit of priority from the prior Japanese Patent Applications No. 2018-217390, filed Nov. 20, 2018; the entire contents of which are incorporated herein by reference.

FIELD

Embodiments described herein relate generally to a magnetic resonance imaging apparatus.

BACKGROUND

An imaging time used by a magnetic resonance imaging (hereinafter referred to as "MRI") apparatus is, for example, approximately a few minutes. Therefore, when imaging an organ that moves such as a heart or an abdomen, biosignals such as electrocardiographic waveforms or respiratory waveforms of a subject may be monitored to perform the imaging in synchronization with these waveforms. However, in order to collect the biosignals of the subject, it is necessary to attach various sensors corresponding to these biosignals to the subject. To attach various sensors to the subject not only causes discomfort to the subject, but also requires the operator to put aside considerable time to make advance preparations for the imaging, likely entailing a decrease in imaging throughput, or the like.

As such, it is suggested that when performing imaging using an MRI apparatus, the biosignals of a subject should be monitored in a non-contact and non-invasive manner. For example, it is suggested that a microwave be used to monitor respiration or electrocardiogram (pulse wave) of the subject without touching the subject. With this suggestion, the movement of the body surface of the subject caused by respiration or heartbeat is monitored by applying an electromagnetic wave in the microwave band (hereinafter referred to as a "microwave") to the body surface of the subject and detecting the phase variation of the returning reflective wave. For example, the movement of the body surface of the subject caused by respiration is approximately several millimeters to several centimeters. Also, the movement of the body surface of the subject caused by heartbeat is, for example, approximately 0.1 mm.

Therefore, the frequency of the microwave may vary depending on the distance in which the body surface of the subject moves. For example, the frequency of the microwave for monitoring respiration ranges from 1 GHz to slightly over 10 GHz, and the frequency of the microwave for monitoring heartbeat ranges from slightly over 10 GHz to slightly over 20 GHz. Since it is necessary to detect a very small movement of the body surface to monitor heartbeat using a microwave, the stability of movement detection is low. Even if the frequency of the microwave is increased, it is difficult to stably detect heartbeat in a non-contact manner.

BRIEF DESCRIPTION OF THE DRAWINGS

FIG. 2 shows an example in which a monitoring coil is mounted in a bed top according to the present embodiment.

FIG. 3 shows an example in which the monitoring coil is mounted in a receiver coil apparatus according to the present embodiment.

FIG. 5 shows an example of the receiver coil apparatus in which the monitoring coil is mounted according to the present embodiment.

FIG. 6 shows an example of a relative arrangement for suppressing electromagnetic coupling between a receiver coil element and the monitoring coil according to the present embodiment.

FIG. 7 shows an example of a relative arrangement for suppressing electromagnetic coupling between the receiver coil element and the monitoring coil according to the present embodiment.

FIG. 8 shows an example of a depth of penetration into a biological model with respect to a frequency of an electromagnetic wave according to the present embodiment.

FIG. 9 shows an example of a relative position relationship between a small subject and the monitoring coil according to the present embodiment.

FIG. 10 shows an example of a relative position relationship between a large subject and the monitoring coil according to the present embodiment.

FIG. 11 shows an example of a physical attribute-frequency correspondence table used in the present embodiment.

FIG. 13 shows an example of a change in the decibel of S11 with respect to a frequency after impedance matching, according to a monitoring frequency in the present embodiment.

FIG. 16 shows an example of a signal indicating a temporal change of S11 before wave detection at the monitoring frequency according to the present embodiment.

FIG. 18 shows an example of a heartbeat waveform according to the present embodiment.

FIG. 20 shows an example of the receiver coil apparatus in which a first monitoring coil and a second monitoring coil are mounted according to the modification of the present embodiment.

DETAILED DESCRIPTION

A magnetic resonance imaging apparatus according to an embodiment is configured to reconstruct an image based on a magnetic resonance signal acquired by imaging, wherein a high-frequency magnetic field is applied to a subject in a static magnetic field in a course of the imaging.

A magnetic resonance imaging apparatus includes a monitoring coil, a measuring device, and processing circuitry.

The monitoring coil continuously transmits to the subject an electromagnetic wave having a monitoring frequency, and without touching the subject.

The measuring device measures a change in the impedance related to the monitoring coil over time to thereby generate a biosignal of the subject.

The processing circuitry is configured to determine the monitoring frequency that is higher than a frequency of a high-frequency magnetic field based on the information of the subject, and to controls a sequence related to the imaging based on the biosignal.

One object of this can be stated as: monitoring biosignals of subjects of various body types with good sensitivity and in a non-contact manner, and to perform imaging using the monitored biosignals.

Hereinafter, the embodiment of the magnetic resonance imaging apparatus (hereinafter referred to as an "MRI apparatus") will be described with reference to the drawings. In the description below, structural elements having substantially the same functions and configurations will be denoted by the same reference symbols, and a repetitive description of such elements will be given only where necessary.

Embodiment

Figure 1:
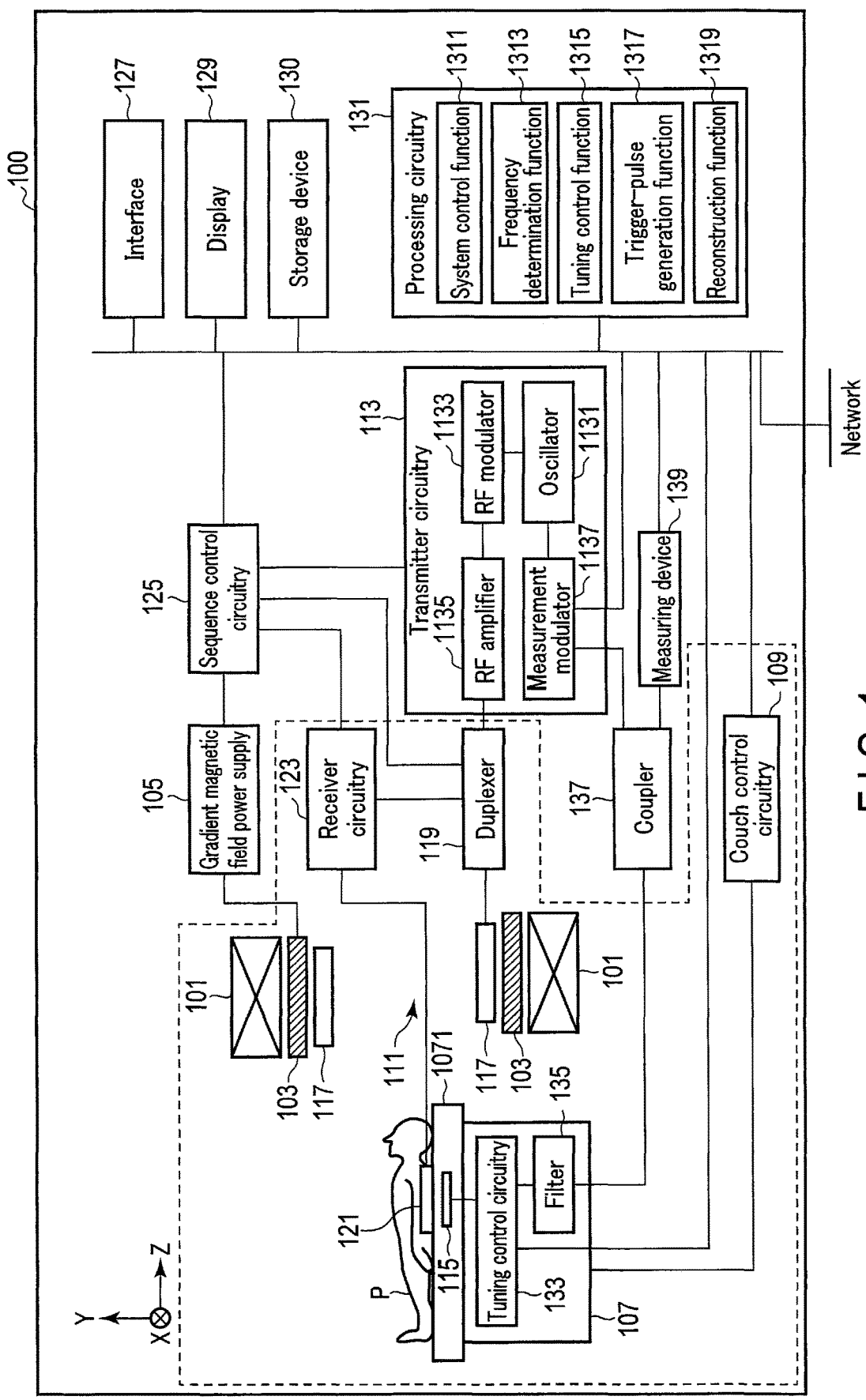
FIG. 1 shows an example of a configuration of a magnetic resonance imaging apparatus according to the present embodiment.

An overall configuration of an MRI apparatus 100 of the present embodiment will be described with reference to FIG. 1. FIG. 1 shows a configuration of the MRI apparatus 100 of the present embodiment. As shown in FIG. 1, the MRI apparatus 100 includes a static field magnet 101, a gradient coil 103, a gradient magnetic field power supply 105, a bed 107, bed control circuitry 109, transmitter circuitry (transmitter) 113, a monitoring coil 115, a transmitter coil 117, a duplexer 119, a receiver coil apparatus 121, a receiver circuitry (receiver) 123, a sequence control circuitry (sequence controller) 125, an interface (input unit) 127, a display 129, a storage device (storage) 130, processing circuitry (processor) 131, a tuning control circuitry (matching unit) 133, a filter 135, a coupler 137, and a measuring device (measuring unit) 139. The MRI apparatus 100 may include a hollow cylindrical shim coil between the static field magnet 101 and the gradient coil 103.

The static field magnet 101 is a hollow and approximately-cylindrical magnet. The static field magnet 101 is not necessarily approximately cylindrical, and may be formed in an open shape. The static field magnet 101 generates a uniform static magnetic field in its inner space. For example, a superconductive magnet or the like is used as the static field magnet 101.

The gradient coil 103 is a hollow cylindrical coil. The gradient coil 103 is arranged on the inner side of the static field magnet 101. The gradient coil 103 is formed by combining three coils respectively corresponding to the X-, Y-, and Z-axes that are orthogonal to one another. The Z-axis direction is the same as the direction of the static magnetic field. The Y-axis direction is a vertical direction, and the X-axis direction is a direction perpendicular to the Z-axis and the Y-axis. The three coils of the gradient coil 103 individually receive a current supplied from the gradient magnetic field power supply 105, and generate gradient fields in which the magnetic field intensity changes along each of the X-, Y-, and Z-axes.

The gradient fields in the X-, Y-, and Z-axes generated by the gradient coil 103 respectively correspond to, for example, a slice selection gradient field, a phase encode gradient field, and a frequency encode gradient field (also referred to as a "readout gradient field"). The slice selection gradient field is used to determine an imaging slice as appropriate. The phase encode gradient field is used to change a phase of a magnetic resonance (hereinafter referred to as "MR") signal in accordance with a spatial position. The frequency encode gradient field is used to change a frequency of an MR signal in accordance with a spatial position.

The gradient magnetic field power supply 105 is a power supply apparatus that supplies a current to the gradient coil 103 under the control of the sequence control circuitry 125.

The bed 107 is an apparatus with a bed top 1071 on which a subject P is placed. The bed 107 inserts the bed top 1071 on which the subject P is placed into a bore ill, under the control of the bed control circuitry 109. The bed 107 is installed in an examination room where the present MRI apparatus 100 is installed, in such a manner that the longitudinal direction of the bed 107 is parallel to the central axis of the static field magnet 101.

The bed control circuitry 109 is circuitry that controls the bed 107. The bed control circuitry 109 drives the bed 107 in accordance with an operator's instruction via the interface 127, to thereby move the bed top 1071 in the longitudinal direction and the vertical direction, and, in some cases, in the horizontal direction. The bed control circuitry 109 is mounted in, for example, the bed 107 or a console apparatus equipped with the interface 127, the display 129, the storage device 130, and the processing circuitry 131.

The transmitter circuitry 113 includes an oscillator 1131, an RF modulator 1133, an RF amplifier 1135, and a measurement modulator 1137. The transmitter circuitry 113 is, for example, mounted in a gantry equipped with the static field magnet 101, the gradient coil 103, and the transmitter coil 117. Namely, the transmitter circuitry 113 is not necessarily installed in a machine room outside a shield room, and may be mounted in a gantry or the like. For example, the inside of the frame indicated by the dashed line in FIG. 1 shows the components arranged in the shield room among the plurality of components of the present MRI apparatus 100.

Under the control of the sequence control circuitry 125, the transmitter circuitry 113 supplies a high-frequency pulse (radio frequency (RF) pulse) modulated to a magnetic resonance frequency (also referred to as Larmor frequency) to the transmitter coil 117 via the duplexer 119. The magnetic resonance frequency is set in advance according to a gyromagnetic ratio corresponding to an atom of a magnetic resonance object and a magnetic flux density of a static magnetic field. When a magnetic flux density of a static magnetic field is 1.5 T, the magnetic resonance frequency is approximately 64 MHz. When a magnetic flux density of a static magnetic field is 3 T, the magnetic resonance frequency is approximately 128 MHz.

Under the control of the sequence control circuitry 125, the transmitter circuitry 113 supplies a signal modulated to a frequency determined by a frequency determination function 1313 to be described later (hereinafter said frequency is referred to as a "monitoring frequency," and said signal is referred to as a "monitoring signal") to the monitoring coil 115 via the coupler 137 and the tuning control circuitry 133. The monitoring frequency corresponds to a frequency for monitoring a biosignal of a subject. For example, the biosignal corresponds to a waveform indicating a scale of a movement of at least one organ of the subject P. The monitoring frequency will be described later.

Specifically, the oscillator 1131 corresponds to a crystal oscillator that uses an oscillator circuit with a crystal vibrator, a frequency multiplier, and the like. Namely, the crystal oscillator is an oscillator configured to use, as a source, an oscillation (system clock) obtained by multiplying an oscillation frequency of the crystal vibrator by an integer using the frequency multiplier. The oscillator circuit need not necessarily use a crystal vibrator, and may use a different vibrator. Also, the oscillator 1131 may be provided in the processing circuitry 131 or in the console apparatus. At this time, the oscillator 1131 serves as an oscillation source for the entire control of the present MRI apparatus 100.

The RF modulator 1133 modulates an oscillation frequency of a signal output from the oscillator 1131 into a magnetic resonance frequency. A signal having a magnetic resonance frequency is formed into an RF pulse via an RF pulse waveform generator (not shown).

The RF amplifier 1135 amplifies an RF pulse having a magnetic resonance frequency, so that it has a predetermined amplitude. For example, the RF amplifier 1135 amplifies the RF pulse, so that it has an amplitude ranging from slightly over 10 kilowatts to several tens of kilowatts. The RF amplifier 1135 supplies the amplified RF pulse to the transmitter coil 117 via the duplexer 119.

The measurement modulator 1137 modulates an oscillation frequency of a signal output from the oscillator 1131 into a monitoring frequency. The measurement modulator 1137 supplies a monitoring signal having a monitoring frequency to the monitoring coil 115.

The monitoring coil 115 includes tuning circuitry (not shown). The tuning circuitry includes a variable condenser. The tuning circuitry changes the electrostatic capacity of the variable condenser according to the monitoring frequency under the control of a tuning control function 1315, which will be described later. Namely, the tuning circuitry performs matching at a 50Ω termination, for example, by adjusting the electrostatic capacity of the variable condenser according to the monitoring frequency under the control of the tuning control function 1315. Thereby, the sensitivity of the monitoring coil 115 is tuned to the monitoring frequency. After performing the matching according to the monitoring frequency, the monitoring coil 115 continuously generates an electromagnetic wave (hereinafter referred to as a "microwave") having the monitoring frequency according to the monitoring signal. Namely, the monitoring coil 115 continuously transmits a microwave to the subject P without touching the subject P.

The tuning circuitry may be configured to switch via the use of a switch element, a fixed capacity condenser selected in advance so as to be tuned to several desired frequencies.

Figure 4:
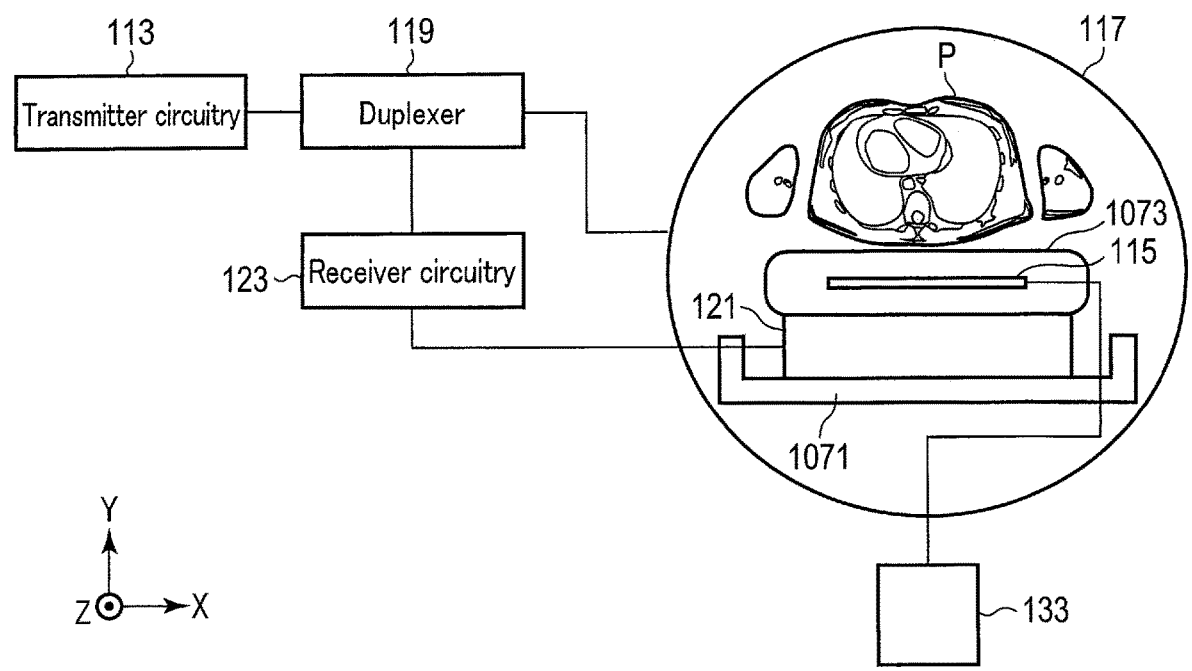
FIG. 4 shows an example in which the monitoring coil is mounted in a pad on the receiver coil apparatus according to the present embodiment.

The monitoring coil 115 is mounted in at least one of the bed top 1071 on which the subject P is placed, the receiver coil apparatus 121, or a pad supporting the subject P on the receiver coil apparatus 121. FIG. 2 shows an example in which the monitoring coil 115 is mounted in the bed top 1071. As shown in FIG. 2, the monitoring coil 115 is located below the receiver coil apparatus 121. FIG. 3 shows an example in which the monitoring coil 115 is mounted in the receiver coil apparatus 121. At this time, the monitoring coil 115 is arranged, for example, between an RF coil of the receiver coil apparatus 121 and the bed top 1071. FIG. 4 shows an example in which the monitoring coil 115 is mounted in a pad 1073 on the receiver coil apparatus 121. As shown in FIG. 4, the monitoring coil 115 is located above the receiver coil apparatus 121 placed on the bed top 1071.

If the receiver coil apparatus 121 is configured by an array coil, a part of the group of coils constituting the array coil or the receiver coil apparatus 121 may also serve the functions related to the monitoring coil 115. At this time, the receiver coil apparatus 121 or a part of the group of coils that also serves the functions related to the monitoring coil 115, functions as a double tuning coil. Furthermore, the receiver coil apparatus 121 including the monitoring coil 115 or the pad 1073 may be arranged in front of the subject P.

The transmitter coil 117 is an RF coil that is arranged on the inner side of the gradient coil 103. The transmitter coil 117 receives an RF pulse supplied from the transmitter circuitry 113 and generates a high-frequency magnetic field. The transmitter coil 117 applies the high-frequency magnetic field to the subject P in the static magnetic field. The transmitter coil 117 is a whole body (WB) coil formed of a single coil. The WB coil 117 may be used as a transmitter-receiver coil. The transmitter coil 117 may also be a WB coil 117 including a plurality of coil elements. Hereinafter, the transmitter coil 117 will be described as a "WB coil 117", capable of transmitting and receiving.

The duplexer 119 switches between the coupling of the transmitter circuitry 113 and the WB coil 117, and the coupling of the WB coil 117 and the receiver coil apparatus 121, under the control of the sequence control circuitry 125. Namely, the duplexer 119 corresponds to a switch (transmission-reception transfer switch) that switches between the transmission of an RF pulse to the WB coil 117 and the reception of an MR signal that is emitted from the subject P by a high-frequency magnetic field. Specifically, the duplexer 119 switches an element to which the WB coil 117 is coupled to the transmitter circuitry 113 or the receiver circuitry 123 under the control of the sequence control circuitry 125, based on a sequence of imaging of the subject P.

The receiver coil apparatus 121 includes an RF coil (receiver coil) arranged on the inner side of the gradient coil 103 in the bore 111. The receiver coil apparatus 121 receives (acquires) an MR signal emitted from the subject P by the imaging (MR imaging) applying a high-frequency magnetic field to the subject P. The receiver coil apparatus 121 outputs the received MR signal to the receiver circuitry 123. The receiver coil apparatus 121 includes, as a receiver coil, a coil array that includes, for example, one or more of, typically, a plurality of coil elements (hereinafter referred to as "receiver coil elements"). The receiver coil apparatus 121 shown in FIG. 1 is arranged on the rear side of the subject P, and the receiver coil element is arranged on the rear side of the subject P. At this time, the receiver coil apparatus 121 is arranged on the bed top 1071, and the subject P is lying on the receiver coil apparatus 121, as shown in FIG. 1.

FIG. 1 shows the WB coil 117 and the receiver coil apparatus 121 as separate coils; however, the receiver coil apparatus 121 may be implemented as a transmitter-receiver coil apparatus that functions to transmit the high-frequency magnetic field of the WB coil 117. In particular, when the intensity of a static magnetic field is higher than 3T, it is efficient for the receiver coil apparatus 121 to have the transmission function. The transmitter-receiver coil apparatus is placed on the bed top 1071 according to an imaging target of the subject P. For example, since the monitoring coil 115 is not mounted in the transmitter-receiver coil for a head, the transmitter-receiver coil apparatus is coupled to the transmitter circuitry 113 and the receiver circuitry 123 via the duplexer 119.

FIG. 5 shows an example of the receiver coil apparatus 121 in which the monitoring coil 115 is mounted. As shown in FIG. 5, the receiver coil apparatus 121, for example, includes 28 receiver coil elements 1211. Each of the 28 receiver coil elements 1211 shown in FIG. 5 is tuned in advance to a magnetic resonance frequency. The MR signal received by the receiver coil element 1211 is output to the receiver circuitry 123 via a transmission line 1213 of the receiver coil apparatus 121.

FIGS. 6 and 7 respectively show an example of a relative arrangement for suppressing electromagnetic coupling between the receiver coil element 1211 and the monitoring coil 115. As shown in FIGS. 5 to 7, the monitoring coil 115 is mounted in the receiver coil apparatus 121 in a position where coupling of the monitoring coil 115 with the receiver coil is reduced. Specifically, the monitoring coil 115 is arranged to be superimposed on a part of the respective receiver coil elements 1211. Thereby, electromagnetic coupling between the receiver coil element 1211 and the monitoring coil 115 is suppressed.

Under the control of the sequence control circuitry 125, the receiver circuitry 123 generates a digital MR signal (hereinafter referred to as "MR data") based on an MR signal output from the receiver coil apparatus 121 via the transmission line 1213. Specifically, the receiver circuitry 123 amplifies the MR signal output from the receiver coil apparatus 121 via a receiver amplifier (not shown). The receiver circuitry 123 performs various types of signal processing on the amplified MR signal, and then performs analog-to-digital (A/D) conversion of the data subjected to the various types of signal processing. The receiver circuitry 123 thereby generates MR data. The receiver circuitry 123 outputs the generated MR data to the sequence control circuitry 125.

In accordance with the sequence output from the processing circuitry 131 and the biosignal of the subject P generated by the measuring device 139, which will be described later, the sequence control circuitry 125 controls the gradient magnetic field power supply 105, the transmitter circuitry 113, the duplexer 119, the receiver circuitry 123, etc., and performs imaging of the subject P. In the sequence, the magnitude of the current supplied to the gradient coil 103 by the gradient magnetic field power supply 105, the timing at which the current is supplied to the gradient coil 103 by the gradient magnetic field power supply 105, the magnitude and duration of the RF pulse supplied to the WB coil 117 by the transmitter circuitry 113, the timing at which the RF pulse is supplied to the WB coil 117 by the transmitter circuitry 113, the timing of the duplexer 119 switching between transmission and reception, the timing at which the MR signal is received by the receiver coil apparatus 121, and the like, are defined according to the inspection type, the sequence type, etc.

For example, the sequence control circuitry 125 controls, based on the biosignal, a sequence related to imaging that applies a high-frequency magnetic field to the subject P in a static magnetic field. Specifically, the sequence control circuitry 125 controls the sequence by using a trigger pulse generated by a trigger-pulse generation function 1317 in the processing circuitry 131 using the biosignal. The generation of the trigger pulse by the trigger-pulse generation function 1317 will be described later. Imaging in accordance with the control of the sequence using the trigger pulse corresponds to imaging synchronized with the biosignal of the subject P.

The interface 127 includes circuitry for receiving various instructions and information input from the operator. The interface 127 includes circuitry relating to, for example, a pointing device such as a mouse, or an input device such as a keyboard. The circuitry included in the interface 127 is not limited to circuitry relating to a physical operational component, such as a mouse or a keyboard. For example, the interface 127 may include an electric signal processing circuitry that receives an electric signal corresponding to an input operation from an external input device provided separately from the present MRI apparatus 100 and outputs the received electric signal to various types of circuitry.

Under the control of the processing circuitry 131, the interface 127 acquires various data from an external storage device, various modalities, a radiology information system (hereinafter referred to as "RIS"), or the like, which is coupled to the interface 127 directly or via a network, or the like. For example, the interface 127 acquires, from the RIS, patient information of the subject P imaged by the present MRI apparatus 100. The interface 127 outputs the acquired patient information to the processing circuitry 131. The patient information includes a height of a body, a weight of a body, age, name, etc., of the subject P. Hereinafter, the body height and the body weight of the patient information are collectively referred to as "physical-attribute information", to simplify the description. The interface 127 may input adjustment of the monitoring frequency based on an operator's instruction. The adjustment of the monitoring frequency refers to, for example, an adjustment of a frequency width related to the adjustment of the monitoring frequency. At this time, the interface 127 outputs the frequency width input by the operator to the processing circuitry 131.

Under the control of a system control function 1311 of the processing circuitry 131, the display 129 displays, for example, an MR image generated by a reconstruction function 1319, various kinds of information on imaging and image processing, a change in impedance related to the monitoring coil 115 acquired by the measuring device 139, and the biosignal generated by the measuring device 139. The display 129 is, for example, a display device, such as a cathode-ray tube (CRT) display, a liquid crystal display, an organic electroluminescence (EL) display, a light-emitting diode (LED) display, a plasma display, or any other display or monitor known in the relevant technical field.

The storage device 130 stores, for example, MR data filled in k-space by the reconstruction function 1319, and MR image data generated by the reconstruction function 1319. The storage device 130 stores, for example, various types of imaging sequences, and imaging conditions including a plurality of imaging parameters that define imaging sequences. The storage device 130 stores programs related to various reconstruction methods used by the reconstruction function 1319.

The storage device 130 stores programs corresponding to various functions executed by the processing circuitry 131. The storage device 130 is, for example, a semiconductor memory element, such as a random access memory (RAM) and a flash memory, a hard disk drive, a solid state drive, or an optical disk. The storage device 130 may be, for example, a drive that reads and writes various kinds of information with respect to a portable storage medium such as a CD-ROM drive, a DVD drive, or a flash memory.

The storage device 130 stores a correspondence table of a plurality of monitoring frequencies with respect to a plurality of physical attributes related to a patient who is to be imaged (hereinafter, said correspondence table is referred to as a "physical attribute-frequency correspondence table"). The physical attribute-frequency correspondence table corresponds to a look-up table (LUT). Each of the physical attributes is defined, for example, by a range of body height corresponding to a predetermined body height range, and a range of body weight corresponding to a predetermined body weight range. Each of the physical attributes may be defined by a statistical body height range and body weight range corresponding to each of the age-based classifications (such as infants, little children, school-age children, young people, and adults).

Also, the physical attribute-frequency correspondence table may be a LUT showing a monitoring frequency with respect to an age, according to a body thickness of a representative subject corresponding to each of the age-based classifications (such as infants, little children, school-age children, young people, and adults).

The monitoring frequency corresponding to the physical attributes shown in the physical attribute-frequency correspondence table will be described. FIG. 8 shows an example of a depth of penetration into a living body with respect to a frequency of an electromagnetic wave. The depth of penetration shown in FIG. 8 corresponds to a depth at which the power of an electromagnetic wave that has penetrated into a biological model is consumed by 50% when the electromagnetic wave is applied to the biological model (for which a thickness of the skin with respect to the body surface is set to 2 mm, a thickness of the fat under the skin is set to 10 mm, and a portion at a depth of 12 mm or below from the body surface is set as muscle). As shown in FIG. 8, when the frequency of the electromagnetic wave applied to the biological model exceeds 1 GHz, the depth of penetration is several millimeters. At this time, the biosignal can mainly capture only the fluctuation of the body surface of the subject P. On the other hand, when the frequency of the electromagnetic wave applied to the biological model is several hundred MHz, the depth of penetration is several centimeters. Therefore, the influence of the movement in the living body can be captured more sharply.

FIGS. 9 and 10 show examples of the relative position relationship between the monitoring coil 115 and subjects having different physical attributes. As shown in FIGS. 9 and 10, the monitoring coil 115 is mounted in the receiver coil apparatus 121. In FIG. 9, a small subject SP is placed on the receiver coil apparatus 121. In FIG. 10, a large subject LP is placed on the receiver coil apparatus 121. Since the lung field moves when breathing occurs, it is possible to obtain a signal reflecting a movement of the subject associated with the breathing even at a position shallow to a certain degree with respect to the body surface of the subject, that is, even when the depth of penetration by the electromagnetic wave applied to the subject is shallow. On the other hand, since the heart moves according to heartbeat, the electromagnetic wave applied to the subject needs to penetrate more deeply into the subject than in the case where the breathing is to be measured. In addition, when obtaining a biosignal for the large subject LP shown in FIG. 10, it is necessary to decrease the monitoring frequency of the microwave so that the electromagnetic wave penetrates more deeply than in the case of the small subject SP shown in FIG. 9.

In consideration of the foregoing, the physical attribute-frequency correspondence table will be described. FIG. 11 shows an example of the physical attribute-frequency correspondence table. In FIG. 11, "HR" represents a body height range, and "WR" represents a body weight range. Hereinafter, the body height range HR and the body weight range WR in FIG. 11 are respectively arranged in ascending order, for convenience of description. The index "n" of HR in FIG. 11 indicates an element count of the body height range. The index "m" of WR in FIG. 11 indicates an element count of the body weight range. In FIG. 11, the supremum of the body height range $HR_i$ of the element i (i being a natural number satisfying $1 \leq i \leq n$), for example, corresponds to a minimum value of the body height range $HR_{(i+1)}$. The infimum of the body height range $HR_{(i+1)}$ may correspond to a maximum value of the body height range $HR_i$. Also, in FIG. 11, the supremum of the body weight range $WR_j$ of the element j (j being a natural number satisfying $1 \leq j \leq m$), for example, corresponds to a minimum value of the body weight range $WR_{(j+1)}$. The infimum of the body weight range $WR_{(j+1)}$ may correspond to a maximum value of the body weight range $WR_j$.

In FIG. 11, when the body height range and the body weight range are ($HR_1$, $WR_1$), the monitoring frequency is associated with $F_{11}$; and when the body height range and the body weight range are ($HR_n$, $WR_m$), the monitoring frequency is associated with $F_{nm}$. When the physical-attribute information of the subject P falls under (body height range $HR_1$, body weight range $WR_1$), the monitoring frequency $F_{11}$ is set to, for example, approximately 1 GHz according to FIG. 8. Also, when the physical-attribute information of the subject P falls under (body height range $HR_n$, body weight range $WR_m$), that is, when the subject P has a maximum body thickness, the monitoring frequency $F_{nm}$ is set to, for example, approximately 200 MHz according to FIG. 8. At this time, the depth of penetration of the microwave is a little less than 30 cm from the body surface of the subject P.

In FIG. 11, the monitoring frequency does not depend on an organ, which is a source of a biosignal, but on the physical attributes of the subject P. The physical attribute-frequency correspondence table may be a correspondence table of a plurality of monitoring frequencies according to the types of biosignals related to synchronized imaging, in addition to the physical attributes of the subject P. "The types of biosignals related to synchronized imaging" refer to imaging synchronized with respiration, imaging synchronized with heartbeat, and the like, and are associated with organs related to the biosignals to be monitored. For example, when a biosignal attributed to a movement of a deep portion, such as a heart, of the subject P is to be monitored, decreasing the frequency as compared to the monitoring frequency for monitoring a biosignal attributed to a movement of the lung field, as shown in FIG. 8, makes the wavelength of the microwave longer. At this time, the measuring device 139 can measure a signal change reflecting a movement of a deeper portion (impedance (S11) related to the monitoring coil 115).

In FIG. 11, a difference ($F_{ij} - F_{(i+1)(j+1)}$) between two monitoring frequencies respectively corresponding to two sets of physical attributes adjacent to each other is set to approximately 10 MHz, for example. The difference between two monitoring frequencies respectively corresponding to two sets of physical attributes adjacent to each other is not limited to 10 MHz, and may be suitably set based on a difference in body thickness between two sets of physical attributes adjacent to each other and the graph shown in FIG. 8.

The processing circuitry 131 includes, as hardware resources, a processor, a memory such as a read-only memory (ROM) and a RAM, which are not shown, and the like, and comprehensively controls the present MRI apparatus 100. The processing circuitry 131 includes the system control function 1311, the frequency determination function 1313, the tuning control function 1315, the trigger-pulse generation function 1317, and the reconstruction function 1319. The functions performed by the system control function 1311, the frequency determination function 1313, the tuning control function 1315, the trigger-pulse generation function 1317, and the reconstruction function 1319 are stored in the storage device 130 in the form of programs executable by a computer. The processing circuitry 131 is a processor that reads the programs corresponding to these functions from the storage device 130 and executes the programs, to thereby implement the functions corresponding to the respective programs. In other words, the processing circuitry 131, after having read the respective programs, includes a plurality of functions, etc., presented in the processing circuitry 131 in FIG. 1.

FIG. 1 illustrates that the various functions are implemented by the single processing circuitry 131; however, the processing circuitry 131 may include a plurality of independent processors, so that the functions are implemented by the respective processors executing the programs. In other words, each of the above-described functions may be configured as a program so that the single processing circuitry executes each program, or a specific function may be implemented in dedicated, independent program-execution circuitry. The system control function 1311, the frequency determination function 1313, the tuning control function 1315, the trigger-pulse generation function 1317, and the reconstruction function 1319 included in the processing circuitry 131 are respectively examples of a system control unit, a frequency determination unit, a tuning control unit, a trigger-pulse generation unit, and a reconstruction unit.

The term "processor" used in the above description means, for example, circuitry such as a central processing unit (CPU), a graphics processing unit (GPU), an application specific integrated circuit (ASIC), or a programmable logic device (e.g., a simple programmable logic device (SPLD), a complex programmable logic device (CPLD), and a field programmable gate array (FPGA)).

The processor implements various functions by reading and executing the programs stored in the storage device 130. The programs may be directly integrated into the circuitry of the processor, instead of being stored in the storage device 130. In this case, the processor implements the functions by reading and executing the programs integrated into the circuitry. Likewise, each of the bed control circuitry 109, the transmitter circuitry 113, the receiver circuitry 123, the sequence control circuitry 125, the measuring device 139, and the like may be configured by electronic circuitry of the above-described processor or the like.

With the system control function 1311, the processing circuitry 131 comprehensively controls the MRI apparatus 100. Specifically, the processing circuitry 131 reads the system control program stored in the storage device 130, develops the program on a memory, and controls the various types of circuitry, etc., of the present MRI apparatus 100 in accordance with the developed system control program. For example, with the system control function 1311 the processing circuitry 131 reads an imaging sequence from the storage device 130 based on conditions for imaging input by an operator through the interface 127. The processing circuitry 131 may generate an imaging sequence based on conditions for imaging. The processing circuitry 131 transmits the imaging sequence to the sequence control circuitry 125 and controls imaging of the subject P.

With the frequency determination function 1313, the processing circuitry 131 determines a monitoring frequency that is higher than a magnetic resonance frequency, which is a frequency of a high-frequency magnetic field, based on information of the subject P. For example, with the frequency determination function 1313, the processing circuitry 131 determines a monitoring frequency that is higher than a magnetic resonance frequency, which is a frequency of a high-frequency magnetic field, based on physical-attribute information of the subject P. Specifically, the processing circuitry 131 determines a monitoring frequency by collating the physical-attribute information of the patient information of the subject P received from the RIS, etc., via the interface 127 with the physical attribute-frequency correspondence table shown in FIG. 11. The processing circuitry 131 outputs the determined monitoring frequency to the measurement modulator 1137 of the transmitter circuitry 113. The physical-attribute information is an example of the information of the subject P.

The processing circuitry 131 may determine a monitoring frequency based on information on the thickness of the fat of the subject P. For example, the processing circuitry 131 determines a monitoring frequency based on a percentage of body fat of the subject P. In this case, a correspondence table of a monitoring frequency with respect to a percentage of body fat of the subject P is used as the physical attribute-frequency correspondence table. A percentage of body fat of the subject P may be obtained, for example, through input performed by an operator. A percentage of body fat of the subject P may also be calculated based on a captured image that makes it possible to estimate the thickness of the fat of the subject P. The captured image that makes it possible to estimate the thickness of the fat of the subject P is, for example, an MRI image of the subject P or a positioning image for MRI imaging. The percentage of body fat of the subject P and the information on the thickness of the fat of the subject P are examples of the information of the subject P.

In addition, the processing circuitry 131 may determine a monitoring frequency based on a patient ID of the subject P. In this case, a correspondence table of a monitoring frequency with respect to a patient ID of the subject P is used instead of the physical attribute-frequency correspondence table. The patient ID of the subject P is an example of the information of the subject P.

When an adjustment of the monitoring frequency is input through the interface 127, the processing circuitry 131, by using the frequency determination function 1313, changes the determined monitoring frequency in accordance with the adjustment input by the operator. The monitoring frequency need not necessarily be adjusted by the operator through the interface 127, and may be automatically adjusted before imaging of the subject P is performed. The automatic adjustment of the monitoring frequency will be described later. The processing circuitry 131 outputs the changed monitoring frequency to the measurement modulator 1137.

With the tuning control function 1315, the processing circuitry 131 controls the tuning control circuitry 133 to perform impedance matching between the monitoring coil 115 and the coupler 137. Specifically, the processing circuitry 131 controls the tuning control circuitry 133 so that impedance matching is achieved at the determined monitoring frequency. The control for performing impedance matching may be performed either in advance before the subject P is placed on the bed top 1071 and imaging of the subject P is performed, or alternatively while the subject P is on the bed top 1071. The processing circuitry 131 controls the variable condenser of the tuning circuitry mounted in the monitoring coil 115 so that the matching is achieved at a 50Ω termination resistance according to the monitoring frequency.

When the monitoring frequency is changed, the processing circuitry 131, by using the tuning control function 1315, controls the tuning control circuitry 133 again so that impedance matching is achieved at the changed monitoring frequency. In addition, when the monitoring frequency is changed, the processing circuitry 131 controls the variable condenser of the tuning circuitry related to the monitoring coil 115 so that the matching is achieved at a 50Ω termination resistance.

With the trigger-pulse generation function 1317, the processing circuitry 131 generates a trigger pulse based on the biosignal of the subject P generated by the measuring device 139. The processing circuitry 131 outputs the generated trigger pulse to the sequence control circuitry 125. The generation of the trigger pulse will be described later.

With the reconstruction function 1319, the processing circuitry 131 fills MR data in the k-space along the readout direction, for example, in accordance with the intensity of the readout gradient magnetic field. The processing circuitry 131 generates an MR image by performing the Fourier transform on the MR data filled in the k-space. An MR image need not necessarily be generated through the above-described procedure, and may be generated by a method of reconstructing an MR image through regularization using MR data accompanied by deficient data, such as parallel imaging and compressed sensing, or via the use of a learned deep neural network that has been trained using MR data accompanied by deficient data. The processing circuitry 131 outputs the MR image to the display 129 and the storage device 130.

The tuning control circuitry 133 is provided between the monitoring coil 115 and the filter 135. Under the control of the tuning control function 1315 of the processing circuitry 131, the tuning control circuitry 133 performs impedance matching between the monitoring coil 115 and the coupler 137. Namely, the tuning control circuitry 133 performs impedance matching at the monitoring frequency on the monitoring coil 115. When the monitoring frequency is changed, the tuning control circuitry 133 further performs impedance matching at the changed monitoring frequency.

The tuning control circuitry 133 may be configured by a plurality of circuits whose impedance has been matched with that of the monitoring coil 115 according to a plurality of monitoring frequencies. At this time, the tuning control circuitry 133, under the control of the tuning control function 1315, functions as a switch connecting the monitoring coil 115 and a circuit that has achieved impedance matching at a monitoring frequency among the plurality of circuits.

The filter 135 is provided between the tuning control circuitry 133 and the coupler 137. The filter 135 inhibits a signal related to an RF pulse having a magnetic resonance frequency from entering the measuring device 139. The filter 135 is a filter that blocks a signal having a predetermined bandwidth around the magnetic resonance frequency. The filter 135 corresponds to, for example, a high-pass filter that allows a frequency band equal to or greater than the lowest value ($F_{11}$) of the monitoring frequency to pass therethrough.

The coupler 137 is provided between the filter 135 and the measuring device 139. The coupler 137 transmits, to the measuring device 139, a signal of S11 corresponding to a reflected signal from the monitoring coil 115. The coupler 137 is also referred to as a "directional coupler".

The measuring device 139 measures a biosignal related to the subject P by monitoring the fluctuation of the impedance (S11) related to the monitoring coil 115, and subjecting the signal of S11 to amplification, digitalization, and filtering or addition processing, as necessary. Namely, the measuring device 139 measures a change in the impedance related to the monitoring coil 115 over time to thereby generate a biosignal of the subject P. The measuring device 139 is implemented by, for example, a spectrum analyzer. Therefore, a detailed description of the measuring device will be omitted. The measuring device 139 outputs the generated biosignal to the processing circuitry 131.

Figure 12:
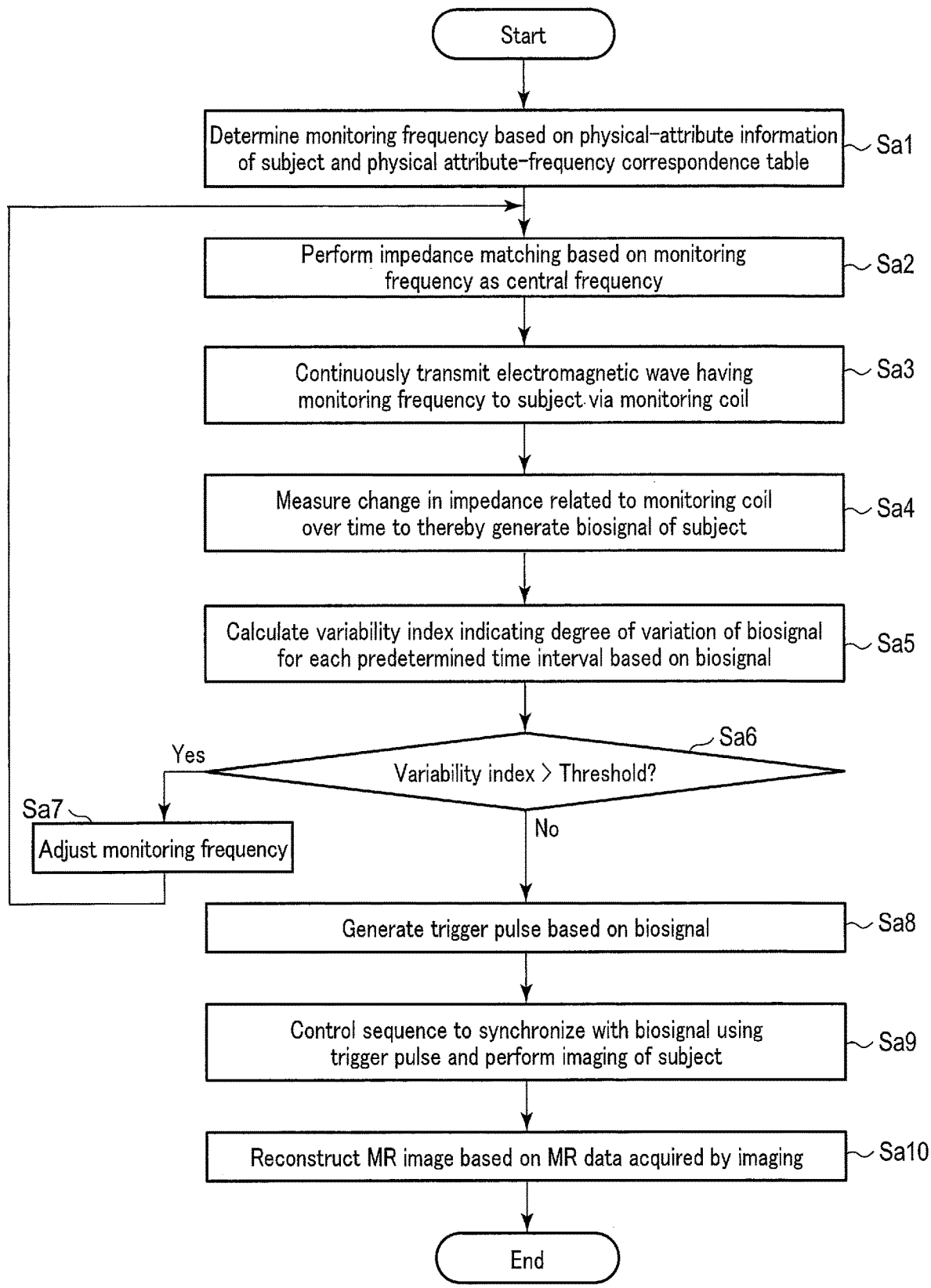
FIG. 12 is a flowchart illustrating an example of the steps of a biosignal-imaging process according to the present embodiment.

The overall configuration of the MRI apparatus 100 according to the present embodiment has been described above. Hereinafter, a process of acquiring a biosignal and performing imaging using the acquired biosignal (hereinafter referred to as a "biosignal-imaging process") according to the present embodiment will be described. FIG. 12 is a flowchart illustrating an example of the steps of the biosignal-imaging process.

(Biosignal-Imaging Process)

(Step Sa1)

With the frequency determination function 1313, the processing circuitry 131 determines a monitoring frequency based on the physical-attribute information of the subject P and the physical attribute-frequency correspondence table. Specifically, in advance of the imaging of the subject P, the interface 127 acquires patient information of the subject P through a network. The interface 127 outputs the acquired patient information to the processing circuitry 131. The processing circuitry 131 reads the physical attribute-frequency correspondence table from the storage device 130. The processing circuitry 131 determines a monitoring frequency by collating the physical-attribute information of the patient information with the physical attribute-frequency correspondence table. The processing circuitry 131 outputs the determined monitoring frequency to the measurement modulator 1137.

If the physical attribute-frequency correspondence table is a correspondence table of a plurality of monitoring frequencies according to the types of biosignals related to synchronized imaging, in addition to the physical attributes of the subject P, the processing circuitry 131, with the frequency determination function 1313, determines a monitoring frequency optimized for the physical attributes of the subject P and an organ to be monitored, based on the physical-attribute information of the subject P, the types of synchronized imaging under imaging conditions, and the physical attribute-frequency correspondence table.

(Step Sa2)

Under the control of the tuning control function 1315, the tuning control circuitry 133 performs impedance matching based on the monitoring frequency as a central frequency. Specifically, with the tuning control function 1315, the processing circuitry 131 controls the tuning control circuitry 133 in order to perform impedance matching based on the monitoring frequency as a central frequency. For example, the tuning control circuitry 133 performs impedance matching so that S11 (decibel) corresponding to the monitoring frequency will be equal to or less than a predetermined decibel.

FIG. 13 shows an example of a change in the decibel of S11 with respect to a frequency after impedance matching according to the monitoring frequency is performed. As shown in FIG. 13, the impedance matching is performed so that S11 will be equal to or less than a predetermined decibel PDB at a monitoring frequency MF. Namely, as the impedance matching by the tuning control function 1315, the processing circuitry 131 controls the tuning control circuitry 133 so that S11 (decibel) corresponding to the monitoring frequency will be equal to or less than the predetermined decibel PDB.

(Step Sa3)

An electromagnetic wave (microwave) having the monitoring frequency MF is continuously transmitted to the subject P via the monitoring coil 115. Specifically, the measurement modulator 1137 of the transmitter circuitry 113 modulates an oscillation frequency of a signal output from the oscillator 1131 into the monitoring frequency MF. The measurement modulator 1137 supplies a monitoring signal having the monitoring frequency MF to the monitoring coil 115. The monitoring coil 115 continuously transmits a microwave to the subject P according to the monitoring signal.

(Step Sa4)

The measuring device 139 measures a change in the impedance (S11) related to the monitoring coil 115 over time to thereby generate a biosignal of the subject P. As indicated by TF in FIG. 13, S11(t) corresponding to the monitoring frequency MF changes over time along with a body movement of the subject P according to respiration and heartbeat, for example. The measuring device 139 outputs the generated biosignal to the processing circuitry 131. The measuring device 139 may output the generated biosignal to the display 129. At this time, the display 129 displays the biosignal under the control of the system control function 1311.

Figure 14:
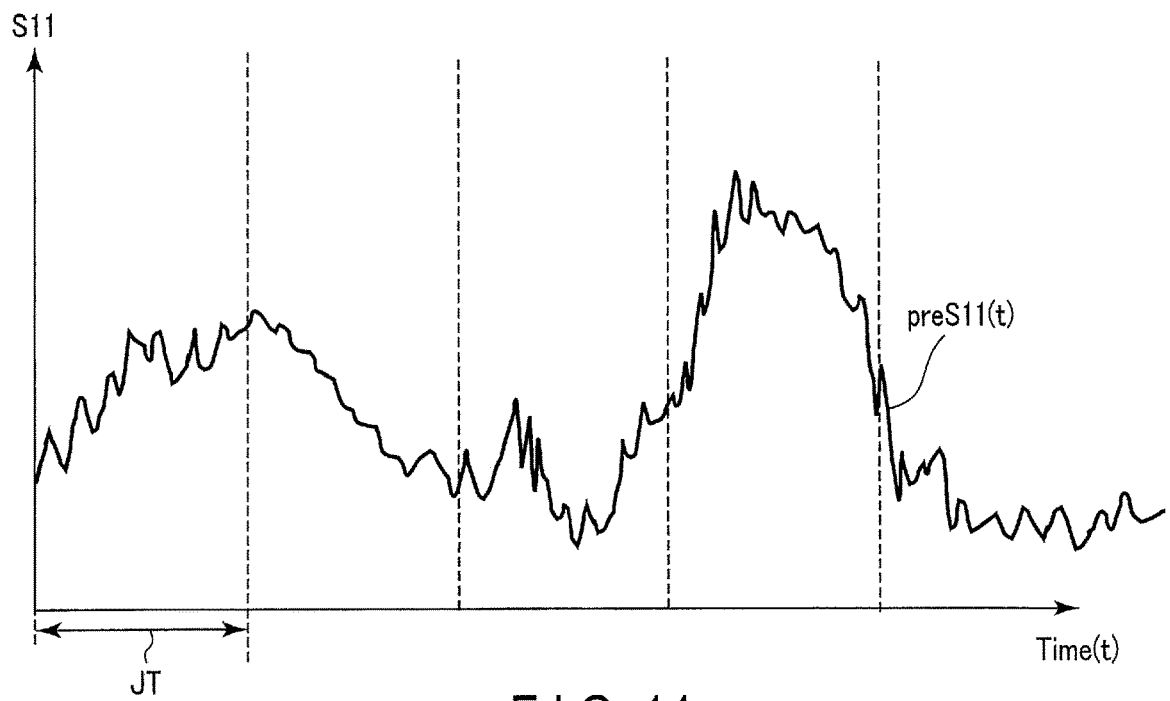
FIG. 14 shows an example of a temporal change of a biosignal prior to imaging generated by a measuring device according to the present embodiment.

FIG. 14 shows an example of a temporal change of a biosignal preS11(t) prior to imaging generated by the measuring device 139 in this step. As shown in FIG. 14, the biosignal preS11(t) varies almost periodically with respect to time.

(Step Sa5)

With the frequency determination function 1313, the processing circuitry 131 calculates a variability index that indicates the degree of variation of the biosignal for each predetermined time interval (hereinafter referred to as an "index calculation time"). The index calculation time is a time interval, for example, approximately 10 ms (milliseconds), that is shorter than the cycle of the biosignal of the subject P. The index calculation time is not limited to 10 ms, and can be discretionarily set. In FIG. 14, the index calculation time is indicated by JT. For example, the variability index corresponds to an index reflecting the influence of noise on the biosignal. Specifically, the variability index corresponds to a ratio of a variance value of a plurality of S11 corresponding to a plurality of sample points (times) of the biosignal included in the index calculation time JT, with respect to an average value of the plurality of S11. In other words, the variability index corresponds to a ratio of a variance value of the impedance related to the monitoring coil 115 to an average value of the impedance related to the monitoring coil 115 in each of a plurality of index calculation times JT. The variability index is not limited to the ratio of a variance value with respect to an average value, and may be, for example, a variation coefficient obtained by dividing an average value by standard deviation, or other statistical exponents reflecting the influence of noise on the biosignal.

(Step Sa6)

With the frequency determination function 1313, the processing circuitry 131 compares the variability index with a threshold. The threshold related to the variability index is stored in the storage device 130, for example. The threshold is set as a value that allows for reduction of the influence of noise on the biosignal, for example, by performing an experiment using a human body model in advance. If the variability index exceeds the threshold (Yes in step Sa6), the processing in step Sa7 is performed. If the variability index is equal to or less than the threshold (No in step Sa6), the processing in step Sa8 is performed.

Figure 15:
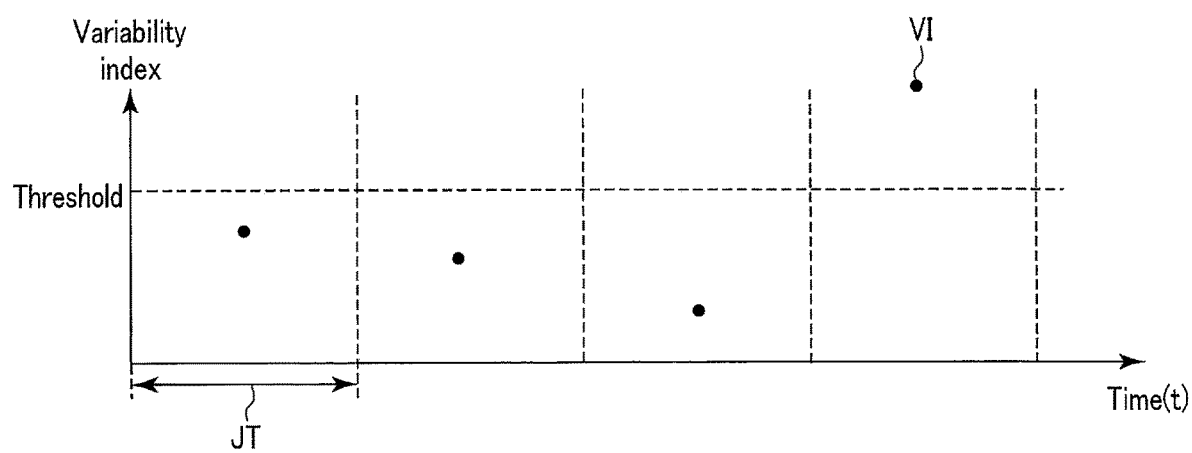
FIG. 15 shows, together with a threshold, an example of a variability index for each index calculation time over a measurement time of a biosignal according to the present embodiment.

FIG. 15 shows, together with the threshold, an example of the variability index for each index calculation time JT over a measurement time of the biosignal. Since the variability index VI exceeds the threshold in FIG. 15, the processing in step Sa7 is performed. The period in which the processing in step Sa5 and the processing in step Sa6 are performed corresponds to the shortest cycle among a plurality of cycles respectively corresponding to a plurality of body movements related to the biosignal. For example, when respiration and heartbeat are measured as the biosignal of the subject P, the period in which the processing in step Sa5 and the processing in step Sa6 are performed is the time corresponding to a single heartbeat. Specifically, when the time of a single heartbeat of the subject P is one second and the index calculation time is 10 ms (0.01 second), and when all of 100 variability indices are equal to or less than the threshold, the processing in step Sa8 is performed. The period in which the processing in step Sa5 and the processing in step Sa6 are performed is not limited to the time corresponding to a single heartbeat, and may be, for example, the time corresponding to a single breath.

(Step Sa7)

With the frequency determination function 1313, the processing circuitry 131 adjusts the monitoring frequency. Specifically, the processing circuitry 131 raises or lowers the monitoring frequency determined in step Sa1. The range of adjustment of the monitoring frequency is, for example, approximately 10 MHz. The range of adjustment is not limited to 10 MHz, and can be discretionarily set. Also, the monitoring frequency changed may be a frequency adjacent to the monitoring frequency determined according to the physical attributes of the subject P in the physical attribute-frequency correspondence table shown in FIG. 11. Integrating the processing in step Sa6 and the processing in step Sa7, the processing circuitry 131 changes the determined monitoring frequency in a predetermined time interval by comparing the ratio of the variance value of the impedance to the average value of the impedance with the threshold. The processing in step Sa2 to step Sa6 is repeated at the monitoring frequency changed in step Sa7. By repeating the processing in step Sa2 to step Sa6, an optimal monitoring frequency according to the physical attributes of the subject is determined.

The processing in step Sa5 to step Sa7 may be performed, for example, as the following procedures. First, the biosignal generated in step Sa4, that is, the change in the impedance is displayed on the display 129. Next, the adjustment of the monitoring frequency is input based on an operator's instruction given via the interface 127. With the frequency determination function 1313, the processing circuitry 131 changes the monitoring frequency in accordance with the input adjustment (i.e., adjusted frequency range). The frequency range is, for example, 10 MHz. The frequency range adjusted by an operator is not limited to 10 MHz, and can be discretionarily set. When the monitoring frequency is changed, the processing in step Sa2 to step Sa4 is performed again. If the adjustment of the monitoring frequency is not input via the interface 127, the processing in step Sa8 is performed, for example, when an instruction to determine the monitoring frequency is input based on an operator's instruction given via the interface 127.

(Step Sa8)

With the trigger-pulse generation function 1317, the processing circuitry 131 generates a trigger pulse based on the biosignal. Hereinafter, the biosignal refers to a waveform corresponding to a movement of the subject P by respiration (hereinafter referred to as a "respiratory waveform") and a waveform corresponding to a movement of the subject P by heartbeat (hereinafter referred to as a "heartbeat waveform"), to provide a concrete description. Prior to the processing in step Sa8, the measuring device 139 generates a respiratory waveform and a heartbeat waveform. The measuring device 139 detects a signal indicating a temporal change in the impedance, that is, a temporal change of S11 at the monitoring frequency, and then performs filtering processing. Through said filtering processing, the measuring device 139 extracts a respiratory waveform and a heartbeat waveform from the signal indicating a temporal change of S11. Said filtering processing may be performed by the processing circuitry 131. For a filter related to the filter processing, there are two types of filters: a filter for extracting a respiratory waveform (hereinafter referred to as a "respiration-extraction filter"); and a filter for extracting a heartbeat waveform (hereinafter referred to as a "heartbeat-extraction filter"). The respiration-extraction filter and the heartbeat-extraction filter are mounted in the measuring device 139. A passband of the respiration-extraction filter is, for example, 0.2 to 0.5 Hz. A passband of the heartbeat-extraction filter is, for example, 0.5 to 3 Hz.

Figure 17:
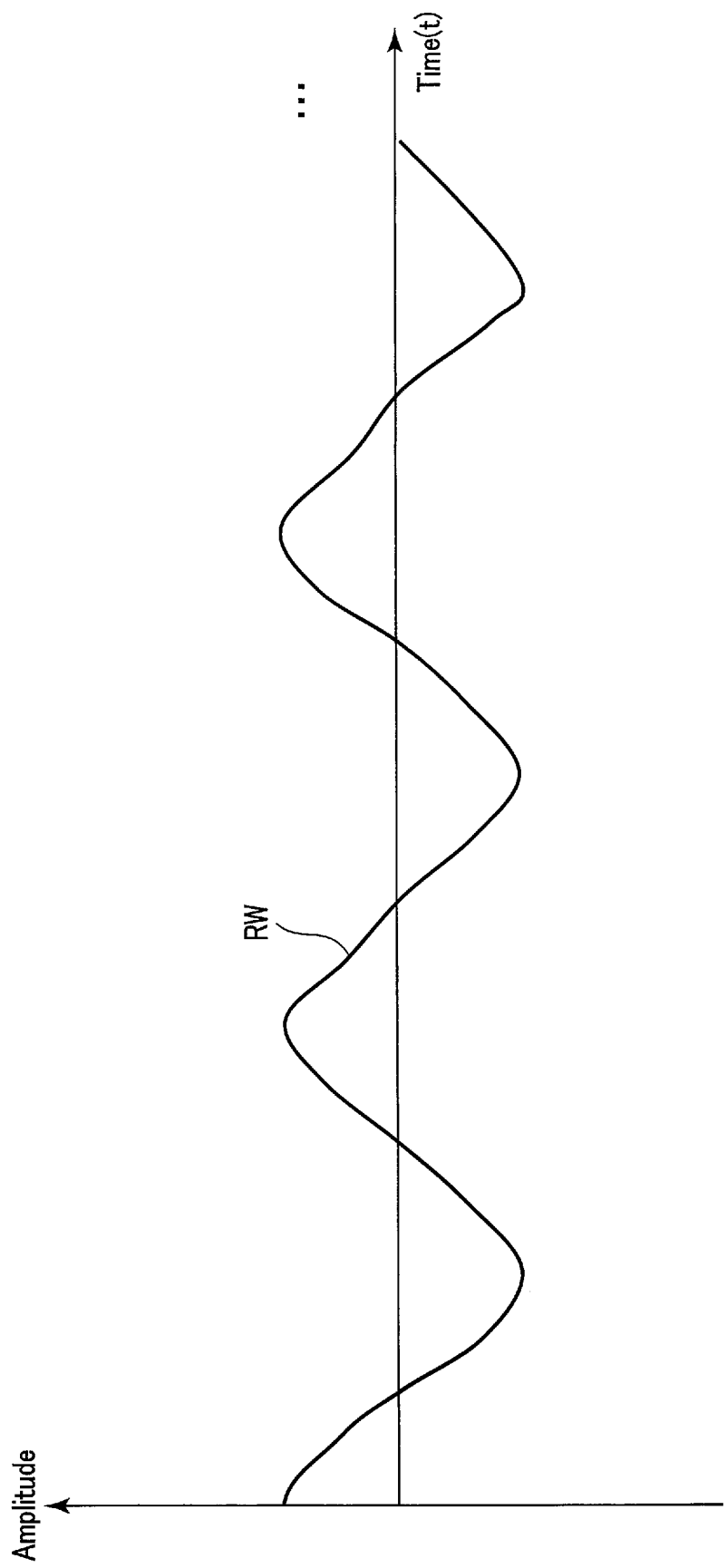
FIG. 17 shows an example of a respiratory waveform according to the present embodiment.

FIG. 16 shows an example of the signal indicating a temporal change of S11 before wave detection at the monitoring frequency. FIG. 17 shows an example of the respiratory waveform. The respiratory waveform shown in FIG. 17 is generated by the detection of the waveform shown in FIG. 16 at the monitoring frequency and the application of the respiration-extraction filter to the detected signal. FIG. 18 shows an example of the heartbeat waveform. The heartbeat waveform shown in FIG. 18 is generated by the detection of the waveform shown in FIG. 16 at the monitoring frequency and the application of the heartbeat-extraction filter to the detected signal.

When respiration-synchronized imaging is set for the subject P, the processing circuitry 131 generates a trigger pulse based on the respiratory waveform using the trigger-pulse generation function 1317. When heartbeat-synchronized imaging is set for the subject P, the processing circuitry 131 generates a trigger pulse based on the heartbeat waveform. The trigger pulse is generated, for example, based on the cycle of the respiratory waveform or heartbeat waveform, and on the time of a maximum wave height. The processing circuitry 131 outputs the generated trigger pulse to the sequence control circuitry 125.

(Step Sa9)

By using the trigger pulse, the sequence control circuitry 125 controls a sequence to synchronize with the biosignal and performs imaging of the subject P (hereinafter referred to as "synchronized imaging"). The sequence control circuitry 125 outputs MR data acquired by synchronized imaging to the processing circuitry 131.

(Step Sa10)

With the reconstruction function 1319, the processing circuitry 131 reconstructs an MR image based on the MR data collected by the imaging in step Sa9. The display 129 displays the reconstructed MR image.

According to the configuration and biosignal-imaging process described above, the following effects can be obtained.

According to the MRI apparatus 100 of the present embodiment, it is possible to determine a monitoring frequency that is higher than a frequency of a high-frequency magnetic field based on the physical-attribute information of the subject P, continuously transmit an electromagnetic wave having the monitoring frequency to the subject P without touching the subject P, generate a biosignal of the subject P by measuring a change in the impedance (S11) related to the monitoring coil 115 over time, and control a sequence related to the imaging based on the biosignal. According to the present MRI apparatus 100, it is possible to mount the monitoring coil 115 in at least one of the bed top 1071 on which the subject P is placed, the receiver coil apparatus 121 with a receiver coil that receives a magnetic resonance signal, or the pad 1073 supporting the subject P on the receiver coil apparatus 121.

According to the MRI apparatus 100 of the present embodiment, it is possible to mount the monitoring coil 115 in the receiver coil apparatus 121 in a position where the coupling of the monitoring coil 115 with the receiver coil is reduced. According to the present MRI apparatus 100, it is possible to store a correspondence table of a plurality of frequencies with respect to a plurality of physical attributes related to a patient who is to be imaged, and determine a monitoring frequency by collating the physical-attribute information with the correspondence table. According to the present MRI apparatus 100, it is possible to display a change in the impedance (S11), input adjustment of the monitoring frequency, and change the monitoring frequency according to the adjustment input. According to the present MRI apparatus 100, it is possible to change the determined monitoring frequency in a predetermined time interval by comparing a ratio of a variance value of the impedance to an average value of the impedance with a threshold.

According to the MRI apparatus 100 of the present embodiment, the matching unit is provided between the measuring device 139 and the monitoring coil 115, and it is possible to perform impedance matching on the monitoring coil 115 at the monitoring frequency, and to further perform impedance matching at a changed monitoring frequency when the monitoring frequency is changed. According to the present MRI apparatus 100, it is possible to apply, by using the monitoring coil 115, a high-frequency magnetic field having a magnetic resonance frequency based on the magnitude of a static magnetic field to the subject P in a course of the imaging of the subject P.

From the foregoing, according to the present MRI apparatus 100, it is possible to determine, change, and adjust an optimal monitoring frequency according to the physical attributes (body types) of subjects even when a body size differs between subjects P, and it is possible to monitor a biosignal attributed to a movement of a heart, a movement caused by respiration, or the like with good sensitivity in a non-contact manner. As a result, it is possible to reduce burdens upon the subject and the operator in the synchronized imaging using the biosignal, and to improve the examination throughput and the accuracy of the synchronized imaging.

(First Modification)

A difference between the present modification and the embodiment is that a plurality of monitoring coils are mounted in the MRI apparatus 100. Hereinafter, to provide a concrete description, the number of monitoring coils is set to two. Two monitoring coils are mounted in the receiver coil apparatus 121. Two monitoring coils may be mounted in the bed top 1071 or the pad 1073.

Figure 19:
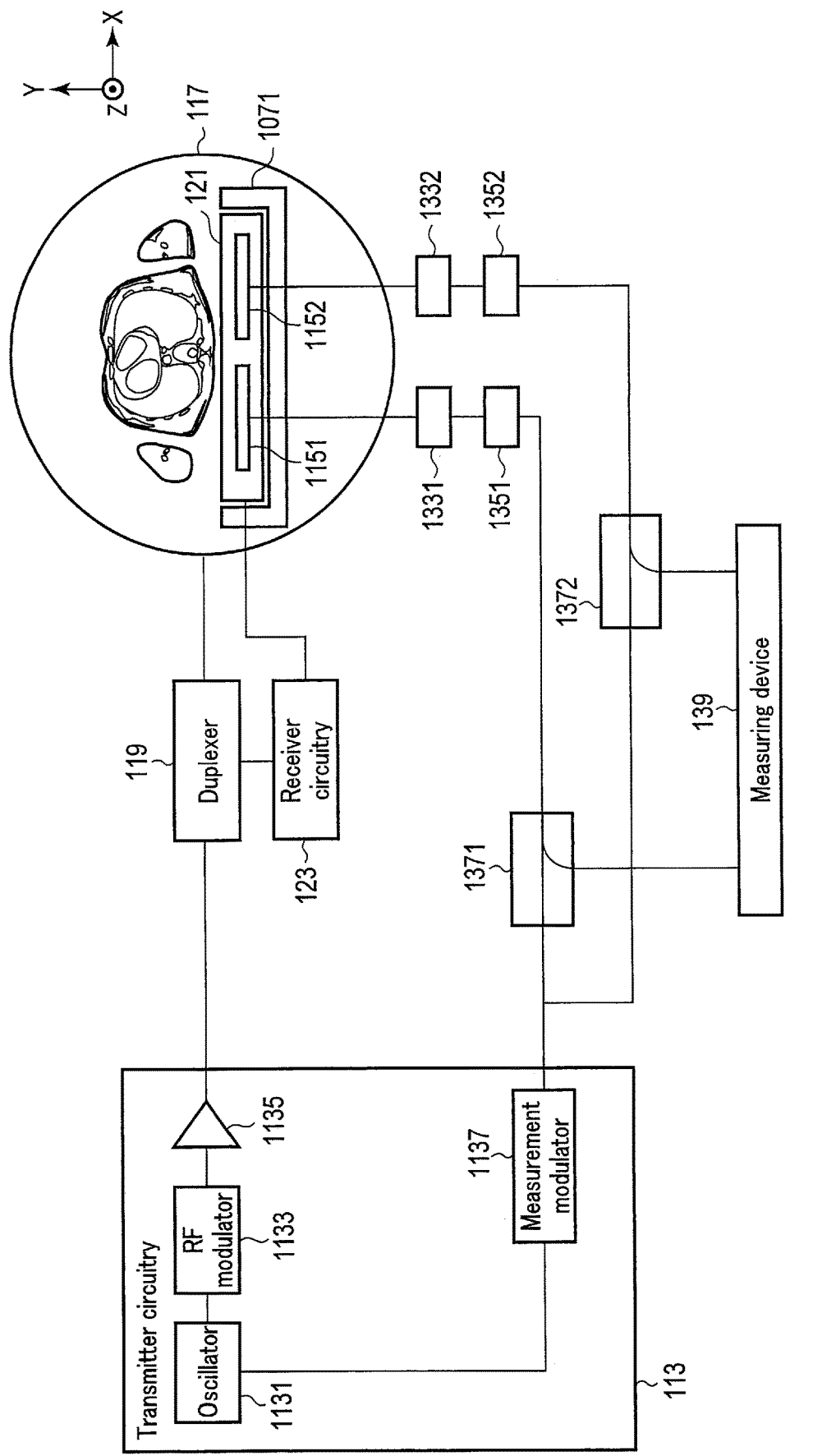
FIG. 19 shows an example of a configuration of the receiver coil apparatus in which two monitoring coils are mounted according to a first modification of the present embodiment, which differs from the example shown in FIG. 3.

FIG. 19 shows an example of a configuration of the receiver coil apparatus 121 in which two monitoring coils are mounted, which differs from the example of the configuration shown in FIG. 3. As shown in FIG. 19, the receiver coil apparatus 121 includes a first monitoring coil 1151 and a second monitoring coil 1152. Also, the tuning control circuitry, the filter, and the coupler are associated with each of the first monitoring coil 1151 and the second monitoring coil 1152; thus, two pieces of tuning control circuitry, two filters, and two couplers are mounted in the MRI apparatus 100.

FIG. 20 shows an example of the receiver coil apparatus 121 in which the first monitoring coil 1151 and the second monitoring coil 1152 are mounted. As shown in FIG. 20, the first monitoring coil 1151 and the second monitoring coil 1152 are arranged on the rear side (bed top side) of the receiver coil element 1211 without overlapping each other. Also, the first monitoring coil 1151 and the second monitoring coil 1152 are mounted in the receiver coil apparatus 121 in a position where coupling of the monitoring coils with the receiver coil element is reduced.

A monitoring signal is output from the transmitter circuitry 113 to each of the first monitoring coil 1151 and the second monitoring coil 1152. Each of the first monitoring coil 1151 and the second monitoring coil 1152 continuously applies a microwave having a monitoring frequency to the subject P.

A first tuning control circuitry 1331 is provided between the first monitoring coil 1151 and a first filter 1351. A second tuning control circuitry 1332 is provided between the second monitoring coil 1152 and a second filter 1352. The first filter 1351 is provided between the first tuning control circuitry 1331 and a first coupler 1371. The second filter 1352 is provided between the second tuning control circuitry 1332 and a second coupler 1372. The first coupler 1371 is provided between the first filter 1351 and the measuring device 139. The second coupler 1372 is provided between the second filter 1352 and the measuring device 139.

The functions related to the first tuning control circuitry 1331, the second tuning control circuitry 1332, the first filter 1351, the second filter 1352, the first coupler 1371, and the second coupler 1372 are the same as those described in the embodiment, a description of those functions will be omitted.

The measuring device 139 generates a biosignal based on the changes of a plurality of impedance values respectively corresponding to the first monitoring coil 1151 and the second monitoring coil 1152. Specifically, the measuring device 139 generates a biosignal with improved S/N by performing predetermined statistical processing on a value of S11 related to the first monitoring coil 1151 (hereinafter referred to as "first S11") and a value of S11 related to the second monitoring coil 1152 (hereinafter referred to as "second S11"). The predetermined statistical processing refers to, for example, correlation processing, accumulation processing, or averaging processing.

According to the present modification, the following effects can be obtained in addition to the effects described in the embodiment.

According to the MRI apparatus 100 of the present modification, it is possible to generate a biosignal by performing statistical processing on the changes of a plurality of impedance values respectively corresponding to the plurality of monitoring coils. Accordingly, the present MRI apparatus 100 can improve accuracy of the biosignal, that is, improve sensitivity of detection of the biosignal.

(Application Example of First Modification)

Figure 21:
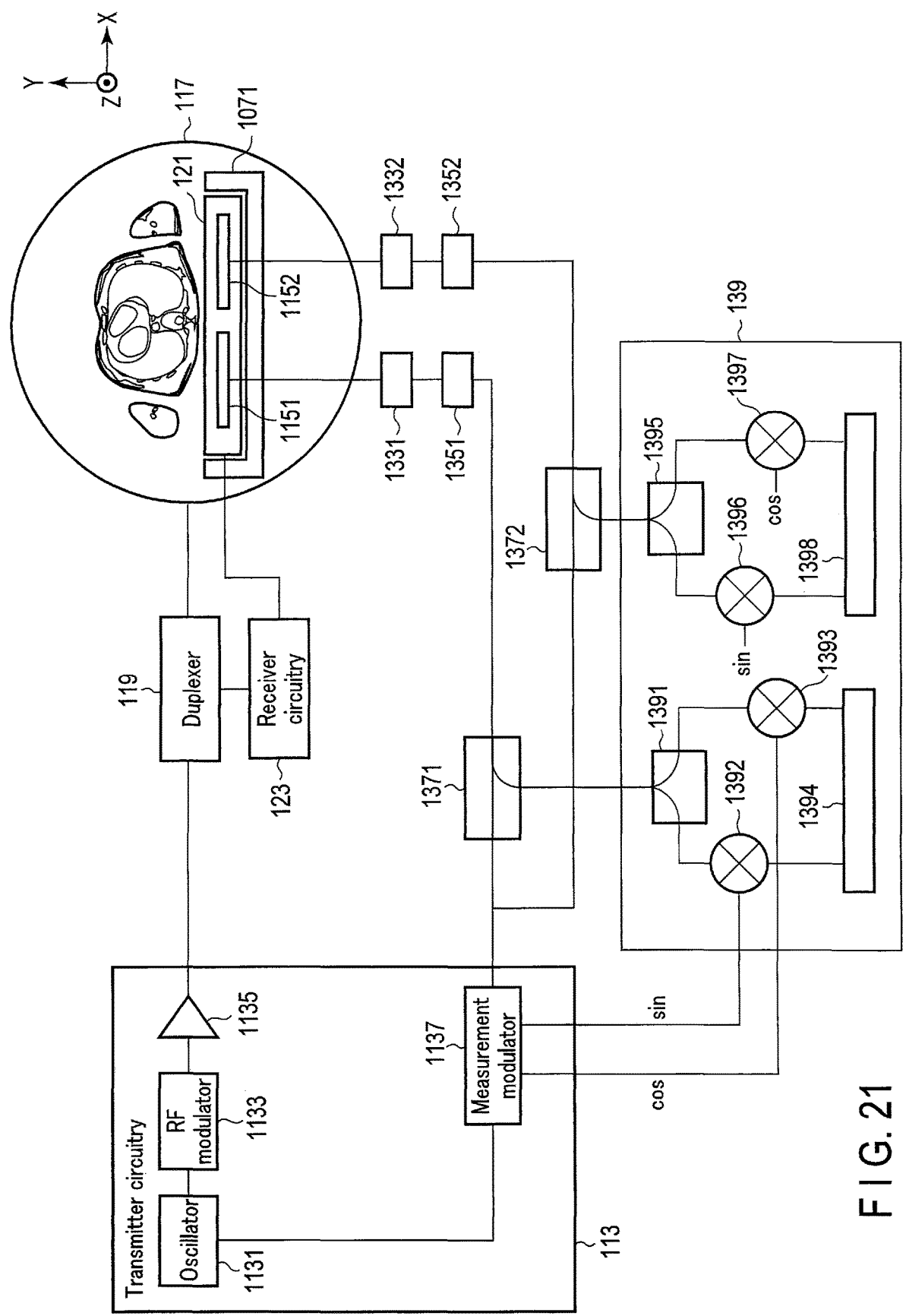
FIG. 21 shows an example of a configuration of the receiver coil apparatus in which two monitoring coils are mounted according to an application example of the present embodiment, which differs from the example shown in FIG. 19.

The present application example is characterized by the fact that orthogonal phase detection is performed on each of the changes of a plurality of impedance values in the measuring device 139 of the above-described modification, and that a biosignal is generated based on the changes of the plurality of impedance values subjected to the orthogonal phase detection. FIG. 21 shows an example of a configuration of the receiver coil apparatus 121 in which two monitoring coils are mounted, which differs from the example of the configuration shown in FIG. 19.

As shown in FIG. 21, the measuring device 139 further includes a first distributor 1391, a first multiplier 1392, a second multiplier 1393, a first detector 1394, a second distributor 1395, a third multiplier 1396, a fourth multiplier 1397, and a second detector 1398. The transmitter circuitry 113 outputs a sine component sin of a monitoring signal (hereinafter referred to as a "sine signal") from the measurement modulator 1137 to the first multiplier 1392 and the third multiplier 1396. The transmitter circuitry 113 outputs a cosine component cos of a monitoring signal (hereinafter referred to as a "cosine signal") from the measurement modulator 1137 to the second multiplier 1393 and the fourth multiplier 1397.

The first distributor 1391 distributes the first S11 to the first multiplier 1392 and the second multiplier 1393. The second distributor 1395 distributes the second S11 to the third multiplier 1396 and the fourth multiplier 1397.

The first multiplier 1392 multiplies the first S11 by the sine signal, and outputs the first S11 multiplied by the sine signal (hereinafter referred to as a "first sine S11") to the first detector 1394. The second multiplier 1393 multiplies the first S11 by the cosine signal, and outputs the first S11 multiplied by the cosine signal (hereinafter referred to as a "first cosine S11") to the first detector 1394.

The third multiplier 1396 multiplies the second S11 by the sine signal, and outputs the second S11 multiplied by the sine signal (hereinafter referred to as a "second sine S11") to the second detector 1398. The fourth multiplier 1397 multiplies the second S11 by the cosine signal, and outputs the second S11 multiplied by the cosine signal (hereinafter referred to as a "second cosine S11") to the second detector 1398.

The first detector 1394 generates an amplitude component of the first S11 (hereinafter referred to as a "first amplitude") and a phase component of the first S11 (hereinafter referred to as a "first phase") by using the first sine S11 and the first cosine S11. The second detector 1398 generates an amplitude component of the second S11 (hereinafter referred to as a "second amplitude") and a phase component of the second S11 (hereinafter referred to as a "second phase") by using the second sine S11 and the second cosine S11.

The measuring device 139 generates an amplitude of a biosignal with improved S/N by performing predetermined statistical processing on the first amplitude and the second amplitude. Also, the measuring device 139 generates a phase of a biosignal with improved S/N by performing predetermined statistical processing on the first phase and the second phase. Integrating the above processing, the measuring device 139 measures a change in an amplitude of a biosignal and a change in a phase of a biosignal by performing orthogonal phase detection on each of the changes of a plurality of impedance values. The measuring device 139 outputs the change in an amplitude of a biosignal and the change in a phase of a biosignal to the processing circuitry 131.

With the trigger-pulse generation function 1317, the processing circuitry 131 generates a trigger pulse based on the change in an amplitude of a biosignal and the change in a phase of a biosignal. For example, the processing circuitry 131 generates a first trigger pulse based on the wave height of the change in an amplitude of a biosignal. Next, the processing circuitry 131 generates a second trigger pulse used for imaging by correcting a repetition frequency (or cycle) of the first trigger pulse based on the change in a phase of a biosignal. The processing circuitry 131 outputs the second trigger pulse to the sequence control circuitry 125.

According to the present application example, the following effects can be obtained in addition to the effects described in the embodiment and the modification.

According to the MRI apparatus 100 of the present application example, it is possible to detect a variation in an amplitude of a biosignal and a variation in a phase of a biosignal by performing orthogonal phase detection on the changes of a plurality of impedance values respectively corresponding to the plurality of monitoring coils, and to generate a trigger pulse based on the variation in an amplitude and the variation in a phase detected. Accordingly, the present MRI apparatus 100 can further improve accuracy of the biosignal, that is, sensitivity of detection of the biosignal, and can generate a higher-accuracy trigger pulse for the biosignal. Through the foregoing, the MRI apparatus 100 according to the present application example can perform imaging with higher synchronization accuracy on the biosignal.

(Second Modification)

A difference between the present modification and the embodiment is that the tuning control function 1315 of the processing circuitry 131 is not performed. Hereinafter, the difference between the present modification and the embodiment will be described, and a description of the configuration, operation and effects identical to those of the embodiment will be omitted.

Figure 22:
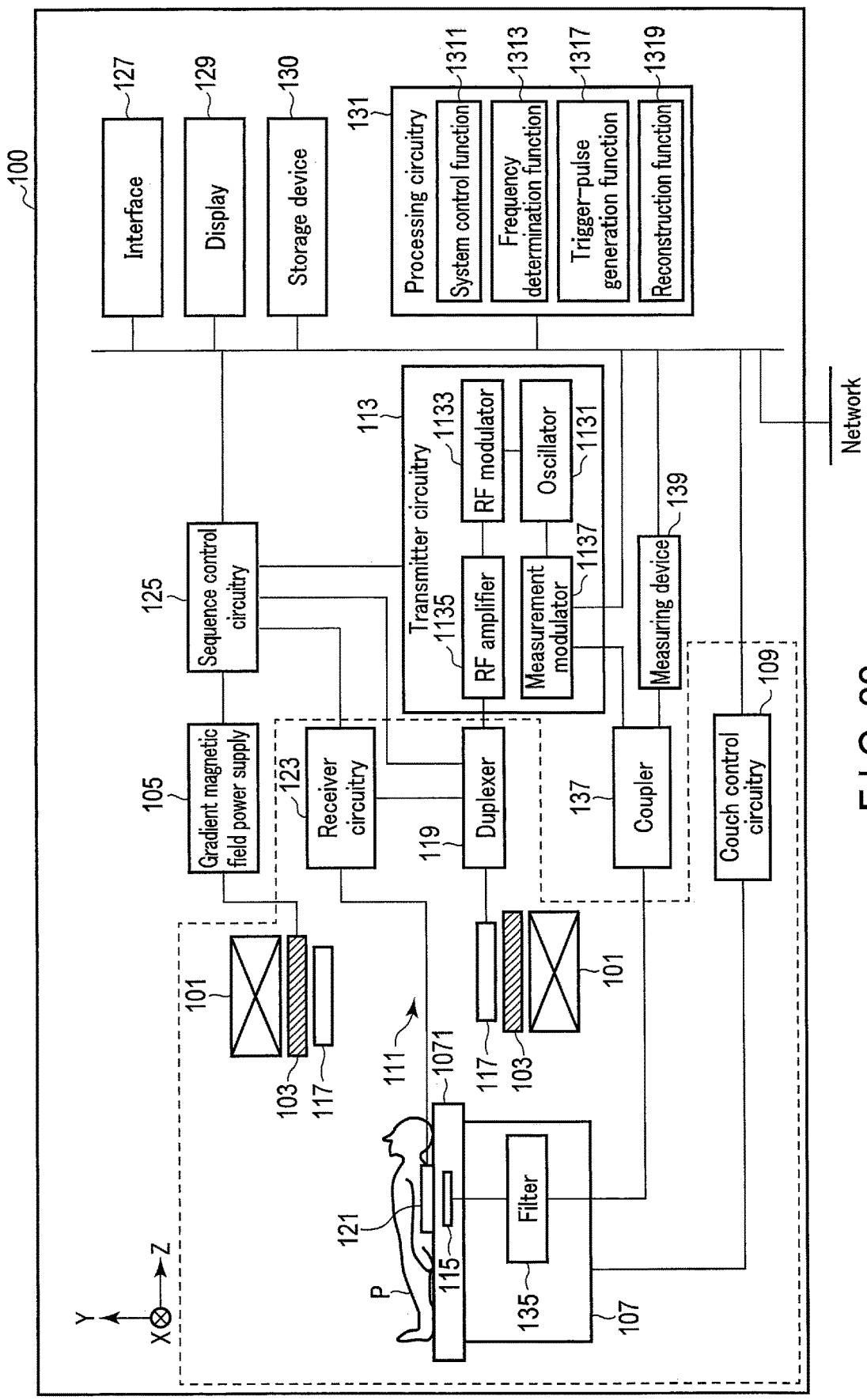
FIG. 22 shows an example of a configuration of a magnetic resonance imaging apparatus according to a second modification of the present embodiment.

FIG. 22 shows a configuration of the MRI apparatus 100 according to the present modification. The tuning control circuitry (133) is not mounted in the MRI apparatus 100. Also, the tuning circuitry that changes the electrostatic capacity of the variable condenser is not mounted in the monitoring coil 115.

Figure 23:
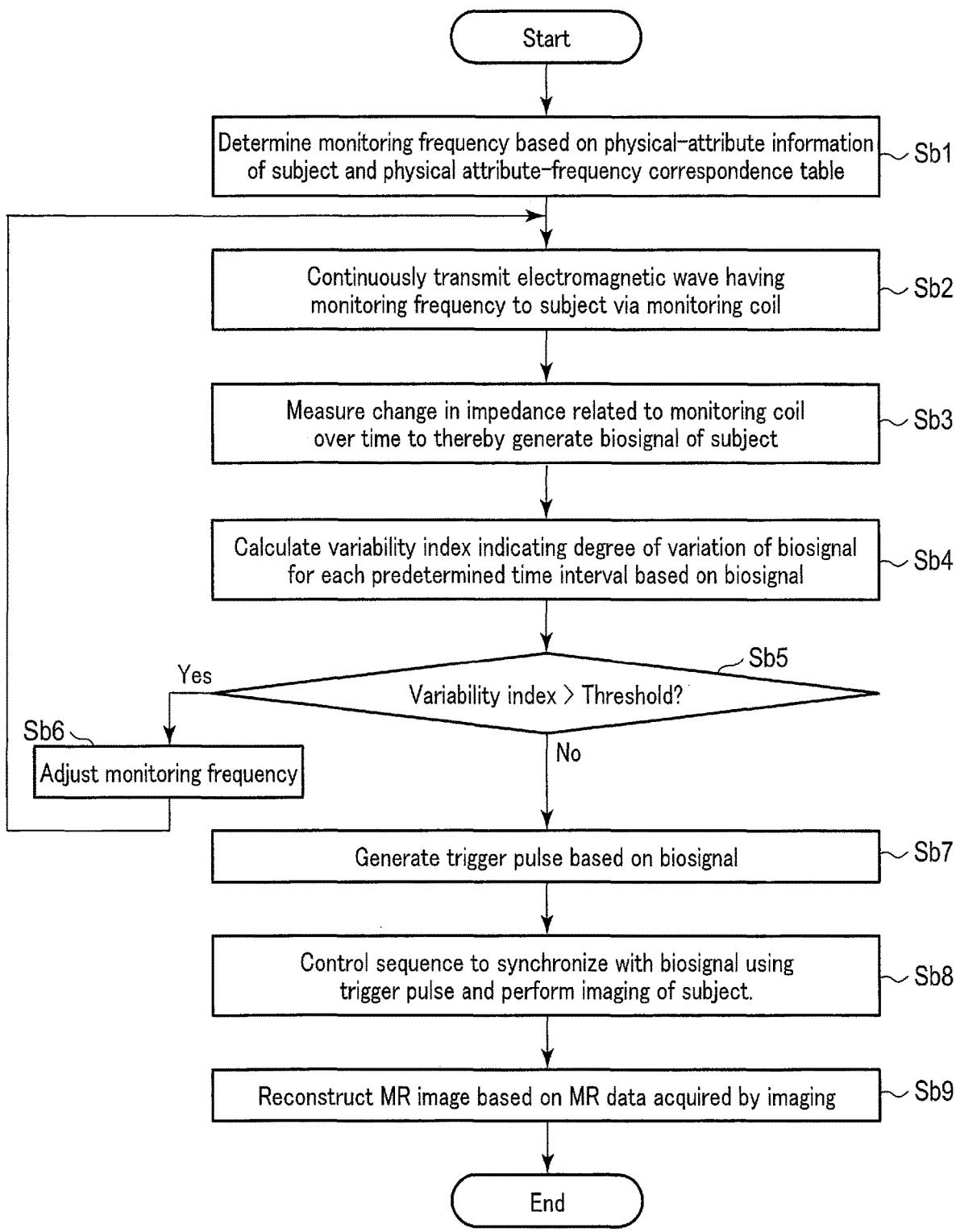
FIG. 23 is a flowchart illustrating an example of the steps of a biosignal-imaging process according to the second modification of the present embodiment.

FIG. 23 is a flowchart illustrating an example of the steps of the biosignal-imaging process according to the present modification. Steps Sb1 to Sb9 respectively correspond to steps Sa1 and Sa3 to Sa10 of the above-described embodiment.

The present modification is adopted, for example, when it is assumed in advance that a difference (gap) between a monitoring frequency determined by the frequency determination function 1313 and a frequency of the monitoring coil 115 is small. Thus, according to the present modification, the number of components to constitute the MRI apparatus 100 can be reduced when the impedance matching between the monitoring coil 115 and the coupler 137 is not needed. Also, according to the present modification, it is possible to reduce the number of cumbersome steps of the biosignal-imaging process and reduce the processing time of the biosignal-imaging process.

According to the embodiment, modifications, application example, etc., described above, it is possible to monitor biosignals of subjects P of various body types with good sensitivity and in a non-contact manner, and perform imaging using the monitored biosignals.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus configured to reconstruct an image based on a magnetic resonance signal acquired by imaging, wherein a high-frequency magnetic field is applied to a subject in a static magnetic field in a course of the imaging, the apparatus comprising:
a monitoring coil configured to continuously transmit an electromagnetic wave having a monitoring frequency to the subject, without touching the subject;
a measuring device configured to measure a change in impedance related to the monitoring coil over time to thereby generate a biosignal of the subject; and
processing circuitry configured to
determine the monitoring frequency that is higher than a frequency of the high-frequency magnetic field based on information of the subject, and
control a sequence related to the imaging based on the biosignal.

2. The magnetic resonance imaging apparatus according to claim 1, wherein the information of the subject is physical-attribute information of the subject.

3. The magnetic resonance imaging apparatus according to claim 1, further comprising a receiver coil apparatus comprising a receiver coil configured to receive the magnetic resonance signal,
wherein the monitoring coil is mounted in at least one of a bed top on which the subject is placed, the receiver coil apparatus, or a pad supporting the subject on the receiver coil apparatus.

4. The magnetic resonance imaging apparatus according to claim 3, wherein the monitoring coil is mounted in the receiver coil apparatus in a position where coupling of the monitoring coil with the receiver coil is reduced.

5. The magnetic resonance imaging apparatus according to claim 1, wherein:
the monitoring coil that is mounted is more than one; and
the measuring device is configured to generate the biosignal by performing statistical processing on changes of a plurality of impedance values respectively corresponding to the more than one monitoring coil.

6. The magnetic resonance imaging apparatus according to claim 5, wherein:
the measuring device is configured to measure a change in an amplitude of the biosignal and a change in a phase of the biosignal by performing orthogonal phase detection on each of the changes of the plurality of impedance values; and
the processing circuitry is further configured to
generate a trigger pulse based on a variation in the amplitude and a variation in the phase; and
control the sequence using the trigger pulse.

7. The magnetic resonance imaging apparatus according to claim 1, further comprising a storage configured to store a correspondence table of a plurality of frequencies with respect to a plurality of physical attributes related to a patient targeted for the imaging, wherein the processing circuitry is further configured to determine the monitoring frequency by collating the information of the subject with the correspondence table.

8. The magnetic resonance imaging apparatus according to claim 1, further comprising:

a display configured to display the change in the impedance; and an input unit configured to input adjustment of the monitoring frequency, wherein the processing circuitry is further configured to change the monitoring frequency according to the adjustment input.

9. The magnetic resonance imaging apparatus according to claim 1, wherein the processing circuitry is further configured to change the determined monitoring frequency in a predetermined time interval by comparing a ratio of a variance value of the impedance to an average value of the impedance with a threshold.

10. The magnetic resonance imaging apparatus according to claim 8, further comprising matching unit provided between the measuring device and the monitoring coil and configured to perform impedance matching at the monitoring frequency on the monitoring coil, wherein, when the monitoring frequency is changed, the matching unit is configured to further perform impedance matching at the changed monitoring frequency.

11. The magnetic resonance imaging apparatus according to claim 1, wherein the monitoring coil is configured to apply, to the subject, the high-frequency magnetic field having a magnetic resonance frequency based on a magnitude of the static magnetic field in a course of the imaging.

\* \* \* \* \*